United States Patent
Asami et al.

(10) Patent No.: US 7,384,828 B2
(45) Date of Patent: Jun. 10, 2008

(54) SEMICONDUCTOR FILM, SEMICONDUCTOR DEVICE AND METHOD OF THEIR PRODUCTION

(75) Inventors: Taketomi Asami, Kanagawa (JP); Mitsuhiro Ichijo, Kanagawa (JP); Noriyoshi Suzuki, Kanagawa (JP); Hideto Ohnuma, Kanagawa (JP); Masato Yonezawa, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 10/835,072

(22) Filed: Apr. 30, 2004

(65) Prior Publication Data

US 2005/0020037 A1 Jan. 27, 2005

Related U.S. Application Data

(62) Division of application No. 10/155,986, filed on May 29, 2002, now Pat. No. 6,743,700.

(30) Foreign Application Priority Data

| Jun. 1, 2001 | (JP) | ............................. 2001-167330 |
| Jul. 10, 2001 | (JP) | ............................. 2001-209354 |
| Sep. 27, 2001 | (JP) | ............................. 2001-295484 |

(51) Int. Cl.
*H01L 21/84* (2006.01)
(52) U.S. Cl. .................... 438/151; 438/485; 438/486; 257/E21.561
(58) Field of Classification Search ........ 438/151–166, 438/485–487; 257/E21.561
See application file for complete search history.

(56) References Cited

U.S. PATENT DOCUMENTS 4,643,527 A * 2/1987 Magarino et al. ............. 438/50
4,646,424 A * 3/1987 Parks et al. ................. 438/158

(Continued)

FOREIGN PATENT DOCUMENTS

EP 0 651 431 B1 3/2002

(Continued)

OTHER PUBLICATIONS

U.S. Appl. No. 10/190,755, filed Jul. 9, 2002 "Semiconductor Film, Semiconductor Device and Method for Manufacturing Same" (Filing Receipt, Specification, Claims and Drawings).

(Continued)

*Primary Examiner*—Richard A. Booth
(74) *Attorney, Agent, or Firm*—Nixon Peabody LLP; Jeffrey L. Costellia

(57) ABSTRACT

A semiconductor film having a crystalline structure is formed by using a metal element that assists the crystallization of the semiconductor film, and the metal element remaining in the film is effectively removed to decrease the dispersion among the elements. The semiconductor film or, typically, an amorphous silicon film having an amorphous structure is obtained based on the plasma CVD method as a step of forming a gettering site, by using a monosilane, a rare gas element and hydrogen as starting gases, the film containing the rare gas element at a high concentration or, concretely, at a concentration of $1 \times 10^{20}/cm^3$ to $1 \times 10^{21}/cm^3$ and containing fluorine at a concentration of $1 \times 10^{15}/cm^3$ to $1 \times 10^{17}/cm^3$.

16 Claims, 16 Drawing Sheets

U.S. PATENT DOCUMENTS

| | | | |
|---|---|---|---|
| 4,727,044 A * | 2/1988 | Yamazaki | 438/166 |
| 4,908,330 A * | 3/1990 | Arai et al. | 438/5 |
| 4,951,602 A | 8/1990 | Kanai | |
| 5,248,630 A | 9/1993 | Serikawa et al. | |
| 5,641,380 A | 6/1997 | Yamazaki et al. | |
| 5,643,826 A | 7/1997 | Ohtani et al. | |
| 5,736,438 A | 4/1998 | Nishimura | |
| 5,789,284 A | 8/1998 | Yamazaki et al. | |
| 5,923,962 A | 7/1999 | Ohtani et al. | |
| 6,013,544 A | 1/2000 | Makita et al. | |
| 6,048,758 A | 4/2000 | Yamazaki et al. | |
| 6,071,766 A | 6/2000 | Yamazaki et al. | |
| 6,077,731 A * | 6/2000 | Yamazaki et al. | 438/150 |
| 6,177,302 B1 * | 1/2001 | Yamazaki et al. | 438/158 |
| 6,285,042 B1 | 9/2001 | Ohtani et al. | |
| 6,309,966 B1 | 10/2001 | Govindarajan et al. | |
| 6,331,457 B1 | 12/2001 | Yamazaki et al. | |
| 6,335,541 B1 | 1/2002 | Ohtani et al. | |
| 6,399,454 B1 | 6/2002 | Yamazaki | |
| 6,429,097 B1 | 8/2002 | Voutsas et al. | |
| 6,489,189 B2 | 12/2002 | Yamazaki et al. | |
| 6,686,262 B2 | 2/2004 | Yamazaki | |
| 6,743,700 B2 | 6/2004 | Asami et al. | |
| 6,962,837 B2 | 11/2005 | Yamazaki | |
| 6,991,976 B2 | 1/2006 | Yamazaki et al. | |
| 6,991,997 B2 | 1/2006 | Takayama et al. | |
| 7,129,120 B2 | 10/2006 | Yamazaki | |
| 2001/0054430 A1 | 12/2001 | Katagiri et al. | |
| 2002/0098628 A1 | 7/2002 | Hamada et al. | |
| 2002/0102764 A1 | 8/2002 | Yamazaki et al. | |
| 2002/0125480 A1 | 9/2002 | Nakamura et al. | |
| 2002/0134981 A1 | 9/2002 | Nakamura et al. | |
| 2002/0151120 A1 | 10/2002 | Yamazaki et al. | |
| 2002/0155652 A1 | 10/2002 | Yamazaki et al. | |
| 2002/0182785 A1 | 12/2002 | Miyairi | |
| 2002/0197785 A1 | 12/2002 | Yamazaki et al. | |
| 2004/0224486 A1 | 11/2004 | Ichijo et al. | |
| 2006/0148216 A1 | 7/2006 | Takayama et al. | |
| 2006/0148218 A1 | 7/2006 | Yamazaki et al. | |

FOREIGN PATENT DOCUMENTS

| | | |
|---|---|---|
| JP | 61-281519 | 12/1986 |
| JP | 02-148715 | 6/1990 |
| JP | 05-109737 | 4/1993 |
| JP | 07-147245 | 6/1995 |
| JP | 07-183540 | 7/1995 |
| JP | 08-078329 | 3/1996 |
| JP | 09-134882 | 5/1997 |
| JP | 09-205213 | 8/1997 |
| JP | 11-031660 | 2/1999 |
| JP | 2000-091242 | 3/2000 |

OTHER PUBLICATIONS

U.S. Appl. No. 10/155,986, filed May 29, 2002 "Semiconductor Film, Semiconductor Device and Method of Their Production" (Filing Receipt, Specification, Claims and Drawings).

U.S. Appl. No. 10/155,986, filed May 29, 2002 "Semiconductor Film, Semiconductor Device and Method of Their Production" (Filing Receipt, Specification, Claims and Drawings).

U.S. Appl. No. 10/190,755, filed Jul. 9, 2002 "Semiconductor Film, Semiconductor Device, and Manufacturing Method Thereof" (Filing Receipt, Specification, Claims and Drawings).

Applied Physics, "Strained Silicon Crystal on SiGe Substrate", vol. 69, No. 11, pp. 1315-1319.

Kessels, W. et al., "Film Growth Precursors in a Remote SiH Plasma Used for High-Rate Deposition of Hydrogenated Amorphous Silicon," J. Vac. Sci. Technol. (Journal of Vacuum Science & Technology), 2000/9, vol. 18, No. 5, pp. 2153-2163.

* cited by examiner

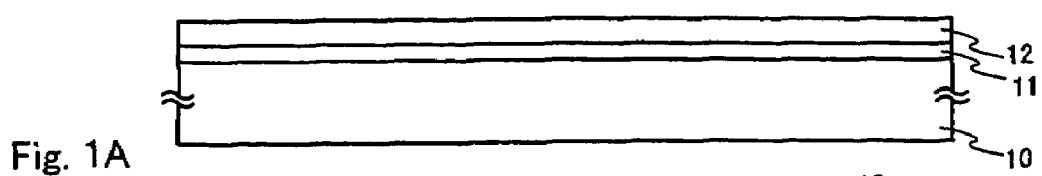
Fig. 1A
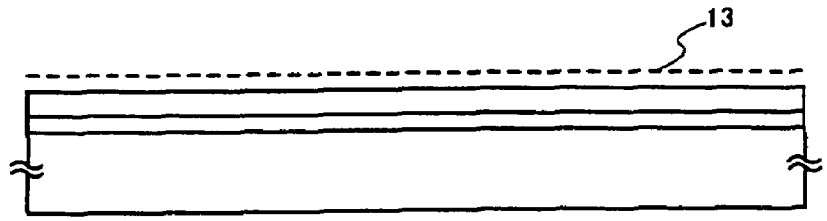
Fig. 1B
Fig. 1C
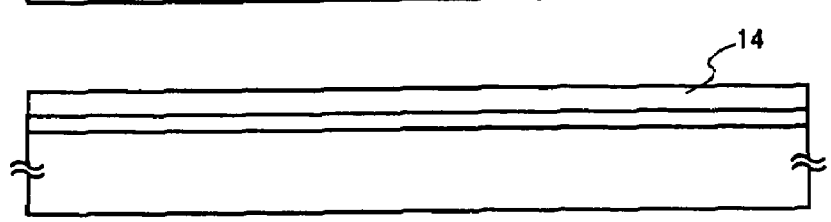
Fig. 1D
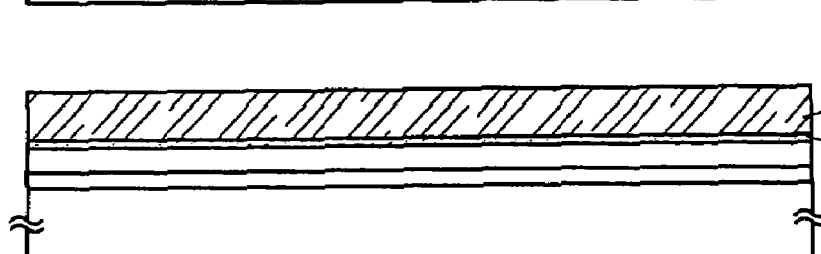
Fig. 1E
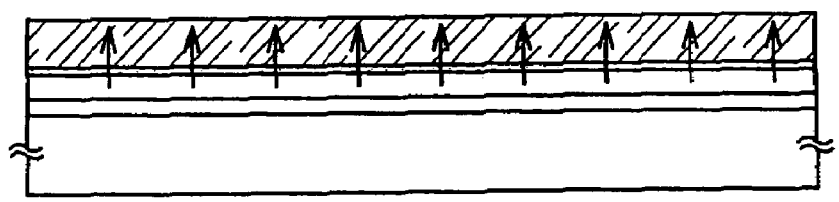
Fig. 1F
Fig. 1G
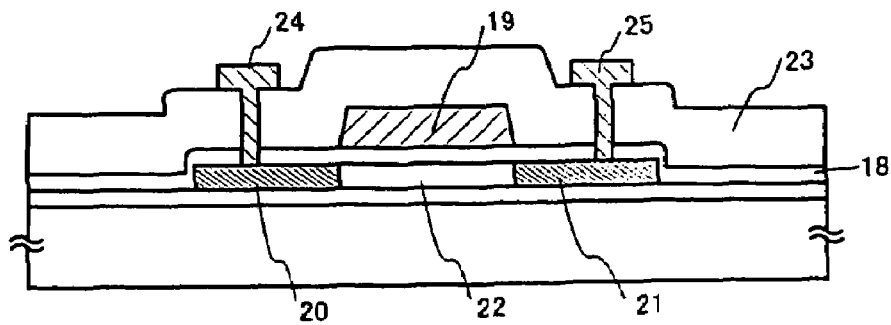

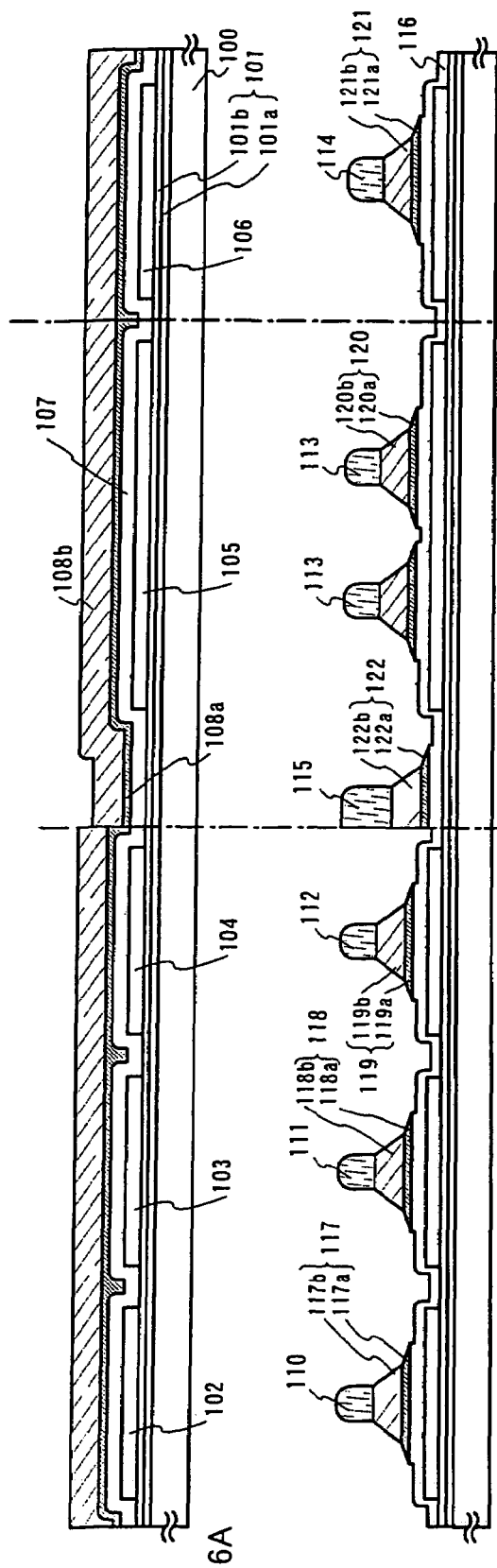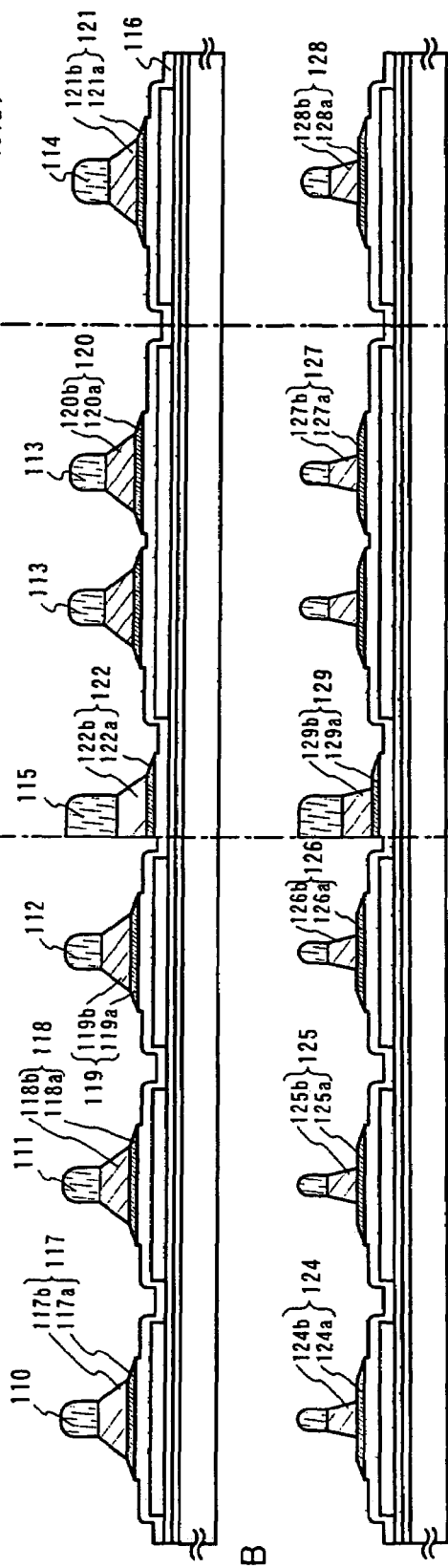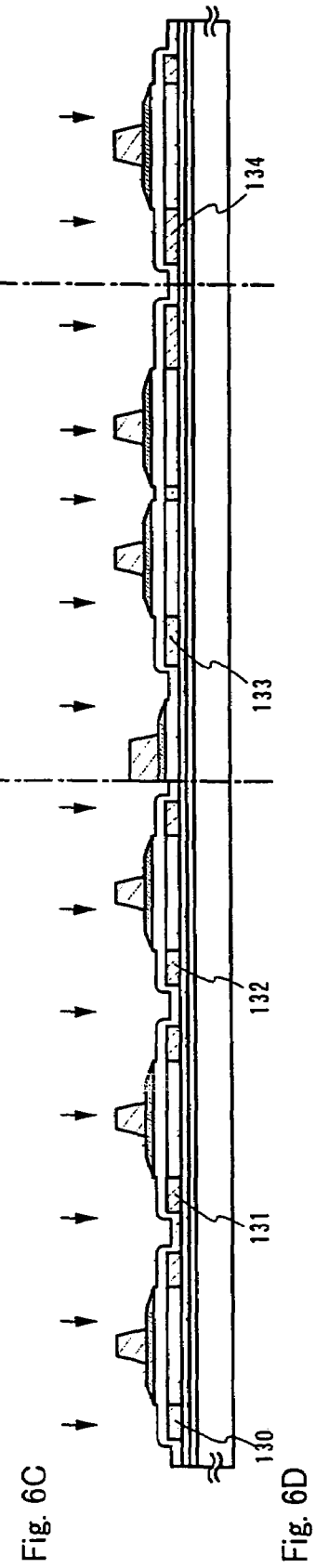

SEMICONDUCTOR FILM, SEMICONDUCTOR DEVICE AND METHOD OF THEIR PRODUCTION

BACKGROUND OF THE INVENTION

1. Field of the Invention

The present invention relates to a method of producing a semiconductor film having an amorphous structure relying upon a plasma CVD method, to a semiconductor device having a circuit constituted by thin-film transistors (hereinafter referred to as TFTs) using the semiconductor film, and to a method of their production. The invention relates to an electro-optical device as represented by, for example, a liquid crystal display panel and to an electronic device mounting such an electro-optical device as a component.

In this specification, the semiconductor device stands for devices that work by utilizing semiconductor characteristics as a whole. Therefore, electro-optical devices, semiconductor circuits and electronic devices are all semiconductor devices.

2. Description of the Related Art

There has heretofore been known a thin-film transistor (hereinafter referred to as TFT) as a typical semiconductor device using a semiconductor film having a crystalline structure. While the TFT is drawing attention as a technology for forming an integrated circuit on an insulating substrate such as of a glass, the liquid crystal display device of the type integral with a drive circuit has now been put into practical use. So far, the semiconductor film having a crystalline structure has been prepared by subjecting the amorphous semiconductor film deposited by plasma CVD method or by a reduced-pressure CVD method to the heat treatment or to the laser-annealing method (technology for crystallizing the semiconductor film by the irradiation with a laser beam).

The semiconductor film having the crystalline structure thus prepared is an aggregate of a number of crystalline particles, and their crystal azimuths are oriented in arbitrary directions and are not controllable, serving as a factor of imposing limitation on the TFT characteristics. In order to cope with the above problem, Japanese Patent Laid-Open No. 7-183540 discloses a technology for preparing a semiconductor film having a crystalline structure by adding a metal element such as nickel that assists the crystallization of a semiconductor film, making it possible not only to lower the heating temperature necessary for the crystallization but also to enhance the orientation of the crystal azimuth in one direction. When a TFT is formed by using the semiconductor film having such a crystalline structure, not only the electric field mobility is improved but also the sub-threshold coefficient (S-value) decreases, and the electric characteristics are strikingly improved.

Use of a metal element that assists the crystallization makes it possible to control the generation of nuclei during the crystallization. Therefore, the film quality becomes homogeneous compared to those obtained by other crystallization methods which permit nuclei to generate in a random fashion. Ideally, it is desired to completely remove the metal element or to a permissible range. With the metal element being added to assist the crystallization, however, the metal element remains in the inside or on the surface of the semiconductor film having the crystalline structure, becoming a cause of dispersion in the characteristics of the elements that are obtained. For instance, the off current increases in the TFT, arousing a problem of dispersion among the individual elements. That is, the metal element for assisting the crystallization turns out to be rather unnecessary after the semiconductor film having the crystalline structure has been formed.

Gettering using phosphorus is effectively utilized as a method of removing the metal element that assists the crystallization from a particular region of the semiconductor film that has the crystalline structure. For example, upon conducting the heat treatment at 450 to 700° C. while adding phosphorus to the source/drain region of the TFT, the metal element can be easily removed from the channel-forming region.

Phosphorus is injected into the semiconductor film having the crystalline structure by the ion-doping method (a method in which $PH_3$ and the like are dissociated with a plasma, and ions are accelerated in an electric field so as to be injected into the semiconductor without, however, separating the ions by mass). For effecting the gettering, however, the phosphorus concentration must not be lower than $1 \times 10^{20}/cm^3$. Addition of phosphorus by the ion-doping method causes the semiconductor film having the crystalline structure to become amorphous, while an increase in the phosphorus concentration hinders the subsequent recrystallization by annealing. Further, phosphorus added at a high concentration brings about an increase in the treatment time needed for the doping, arousing a problem of decrease in the throughput in the doping step.

Further, the concentration of boron for inverting the type of electric conduction must be 1.5 to 3 times as great as that of phosphorus added to the source/drain region of the p-channel TFT, bringing about a problem of an increase in the resistance in the source/drain region accompanied by a difficulty in effecting the recrystallization.

When the gettering is not sufficiently conducted and becomes irregular in the substrate, a difference or dispersion occurs in the characteristics of the TFTs. In the case of the transmission-type liquid crystal display device, a dispersion in the electric characteristics of the TFTs arranged in the pixel portions turns out to be a dispersion in the voltage applied to the pixel electrodes, whereby a dispersion occurs in the amount of light transmitted which is, then, perceived by the eyes of the viewer as the shade in the display.

For the light-emitting device using OLEDs, TFTs are indispensable elements for realizing the active matrix drive system. Therefore, the light-emitting device using OLEDs must have at least TFTs that work as switching elements and TFTs for feeding a current to the OLED in each of the pixels. Irrespective of the circuit constitution of the pixel and the driving method thereof, the brightness of the pixel is determined by the on current ($I_{on}$) of the TFT that is electrically connected to the OLED and feeds the current to the OLED. Therefore, when white is displayed on the whole surface, dispersion occurs in the brightness unless the on current is maintained constant.

This invention is concerned with means for solving the above problems, and provides a technology for effectively removing the metal element remaining in the film after the semiconductor film having the crystalline structure is obtained by using the metal element that assists the crystallization of the semiconductor film.

The gettering technology is occupying a position as an important technology in the production of integrated circuits by using a single crystalline silicon wafer. Gettering is a technology in which metal impurities taken in by the semiconductor are segregated to a gettering site due to some energy, whereby the impurity concentration is lowered in the active region of the element. Gettering can roughly be divided into two; i.e., extrinsic gettering and intrinsic gettering. The extrinsic gettering brings about the gettering effect by applying a distorted field or a chemical action from the outer side. This can be represented by the gettering by which phosphorus ions of a high concentration are diffused from the back surface of a single crystalline silicon wafer. The above-mentioned gettering using phosphorus can be regarded to be a kind of the extrinsic gettering.

On the other hand, the intrinsic gettering is the one which utilizes the distorted field of lattice defect caused by oxygen formed in the single crystalline silicon wafer. This invention is based on the intrinsic gettering that utilizes the lattice defect or lattice distortion, and employs the following means for being adapted to the semiconductor film having a thickness of about 10 to about 100 nm and having a crystalline structure.

This invention comprises the steps of forming a first semiconductor film having a crystalline structure on the insulating surface by using a metal element that assists the crystallization of a semiconductor; forming a film (barrier layer) that serves as an etching stopper on the first semiconductor film; forming a second semiconductor film (gettering site) containing a rare gas element on the barrier layer; gettering the metal element into the gettering site; and removing the second semiconductor film.

In the step of forming the gettering site according to the present invention, a film is formed by the plasma CVD method by using a monosilane, a rare gas element and hydrogen as starting gases, and the film is used as a semiconductor film or, typically, as an amorphous silicon film containing the rare gas element at a high concentration and having an amorphous structure. It is also allowable to use a disilane or a trisilane instead of the monosilane. The plasma CVD method is capable of cleaning the interior of the film-forming chamber (also called chamber) with a gas, requires less maintenance than the sputtering method and is, hence, a film-forming method adapted to mass production.

Besides, this method forms the film by using hydrogen as one of the starting gases and, hence, hydrogen is contained at a decreased concentration in the film as compared to that of when hydrogen is not used as one of the starting gases. As compared to when hydrogen is not used as one of the starting materials, further, fluorine is contained in the film at a decreased concentration since the film is formed by using hydrogen as one of the starting gases.

A method of producing a semiconductor film constituted according to this invention and disclosed in this specification comprises introducing a monosilane, a rare gas and hydrogen as starting gases into a film-forming chamber, generating a plasma, and forming, on a surface on which the film is to be formed, a semiconductor film containing a rare gas element at a concentration of $1\times10^{18}/cm^3$ to $1\times10^{22}$ cm$^3$ and having an amorphous structure.

In generating the plasma in the above constitution, it is desired that the pressure in the film-forming chamber is from 2.666 Pa to 133.3 Pa and, desirably, smaller than 53.32 Pa (0.4 Torr).

In the above constitution, further, the ratio of flow rate of hydrogen to the rare gas ($H_2$/rare gas) is controlled to be from 0.2 to 5.

In the above constitution, further, the RF power density for generating the plasma is from 0.0017 W/cm$^2$ to 1 W/cm$^2$. When the RF power is not smaller than 1 W/cm$^2$, the film becomes defective, such as becoming powdery or forming semispherical bubbles on the film surface.

In the above constitution, further, the monosilane, the rare gas element and hydrogen are used as starting gases being controlled at a ratio (monosilane:rare gas) of from 0.1:99.9 to 1:9 and, preferably, from 1:99 to 5:95 to form the film thereby to obtain a semiconductor film or, typically, an amorphous silicon film containing the rare gas element at a high concentration and having an amorphous structure. It is further allowable to use a disilane or a trisilane instead of the monosilane. The temperature for forming the film is preferably from 300 to 500° C.

In the above constitution, further, the fluorine concentration in the semiconductor film is from $2\times10^{16}/cm^3$ to $8\times10^{16}/cm^3$ and, preferably, from $1\times10^{15}/cm^3$ to $1\times10^{17}/cm^3$.

A method of producing a semiconductor device constituted according to this invention and disclosed in this specification comprises a first step of forming a first semiconductor film having an amorphous structure on an insulating surface; a second step of adding a metal element to the first semiconductor film having the amorphous structure; a third step of forming a first semiconductor film having a crystalline structure by crystallizing the first semiconductor film; a fourth step of forming a barrier layer on the surface of the first semiconductor film having the crystalline structure; a fifth step of forming a second semiconductor film containing a rare gas element on the barrier layer by a plasma CVD method; a sixth step of removing or decreasing the metal element in the first semiconductor film having the crystalline structure by gettering the metal element into the second semiconductor film; and a seventh step of removing the second semiconductor film.

In the above constitution, the second semiconductor film is formed by plasma CVD method that generates plasma by introducing the monosilane, the rare gas and hydrogen gas as the starting gases into the film-forming chamber.

In the above constitution, further, the metal element is the one for assisting the crystallization of silicon, and is one or more kinds of those selected from Fe, Ni, Co, Ru, Rh, Pd, Os, Ir, Pt, Cu and Au.

In the above constitution, further, the rare gas element is one or more kinds of those selected from He, Ne, Ar, Kr and Xe.

BRIEF DESCRIPTION OF THE DRAWINGS

FIGS. 1A to 1G is a diagram illustrating the steps of producing a TFT;

FIGS. 6A to 6D are a diagrams illustrating the steps of producing an active matrix substrate;

EXPERIMENT 1

Experiment was conducted to examine the argon concentration in the amorphous silicon film formed on the semiconductor substrate by the plasma CVD method by using the monosilane, argon and hydrogen as the starting gases depending upon the RF power density.

First, the semiconductor substrate was conveyed into the chamber, heated and maintained at 300° C., and the pressure in the chamber was adjusted by the exhaust system to be 66.65 Pa (0.5 Torr). Next, an SiH$_4$ gas was introduced into the chamber from a gas introduction system at a flow rate of 100 sccm, and a first amorphous silicon film was formed by the plasma CVD method while conducting the electric discharge from an RF power source at a discharge frequency of 27.12 MHz, an RF power of 20 W (RF power density of 0.033 W/cm$^2$ (electrode area of 600 cm$^2$). The first amorphous silicon film was for a reference.

Next, a second amorphous silicon film was formed maintaining a thickness of 200 nm on the first amorphous silicon film. The second amorphous silicon film was formed by the plasma CVD method by maintaining the temperature at 300° C., adjusting the pressure in the chamber to be 26.66 Pa (0.2 Torr) by the exhaust system, introducing the SiH$_4$ gas at a flow rate of 100 sccm, the argon gas at a flow rate of 500 sccm and the nitrogen gas at 200 sccm into the chamber from the gas introduction system, while conducting the electric discharge from an RF power source at a discharge frequency of 27.12 MHz and an RF power of 20 W (RF power density of 0.033 W/cm$^2$).

Next, on the second amorphous silicon film were formed, while changing the RF power condition only, a third amorphous silicon film (RF power density of 0.166 W/cm$^2$), a fourth amorphous silicon film (RF power density of 0.333 W/cm$^2$) and a fifth amorphous silicon film (RF power density of 0.5 W/cm$^2$).

Figure 2A:
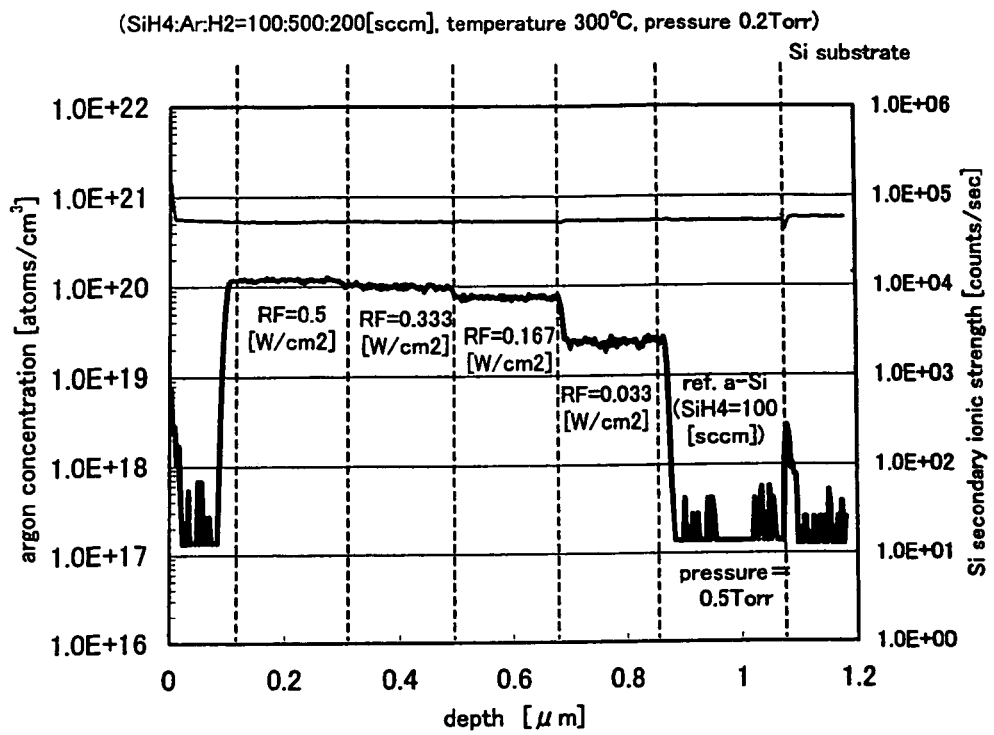
FIG. 2A is a diagram of SIMS data (dependency upon the RF power) depicting argon concentrations.
Figure 2B:
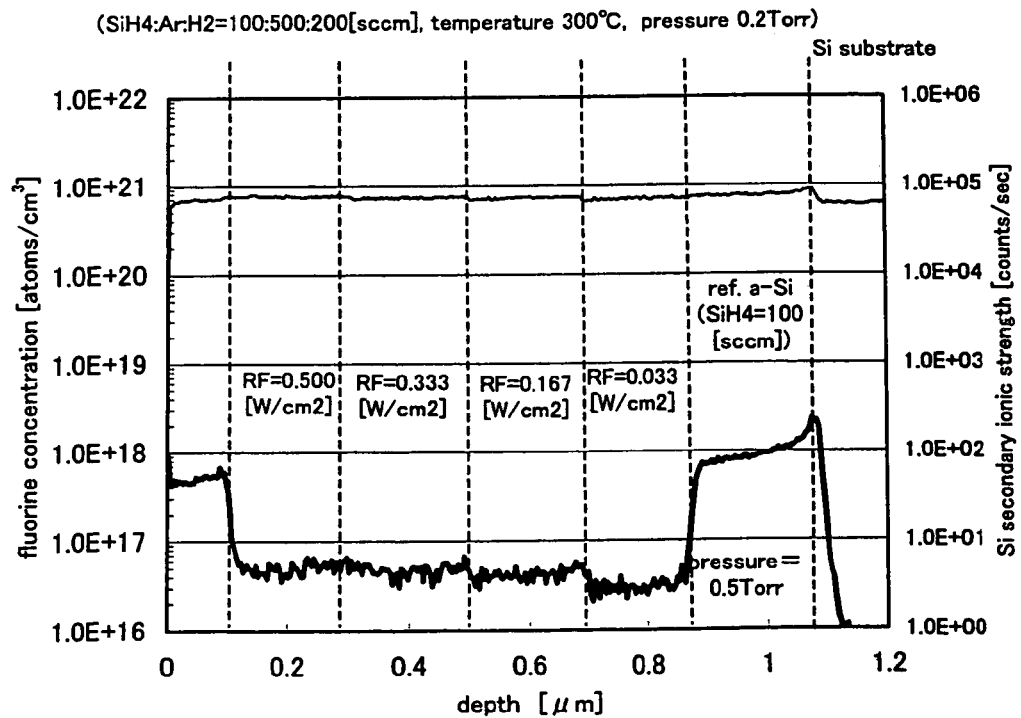
FIG. 2B is a diagram of SIMS data depicting fluorine concentrations (Experiment 1)
Figure 3A:
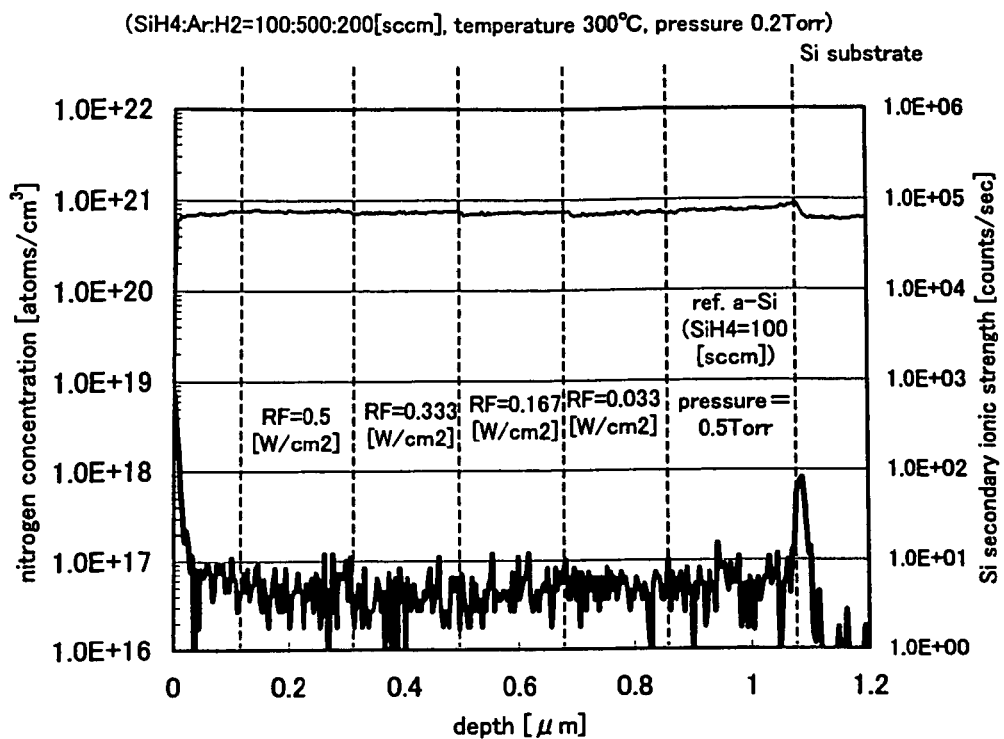
FIG. 3A is a diagram of SIMS data depicting oxygen concentrations.
Figure 3B:
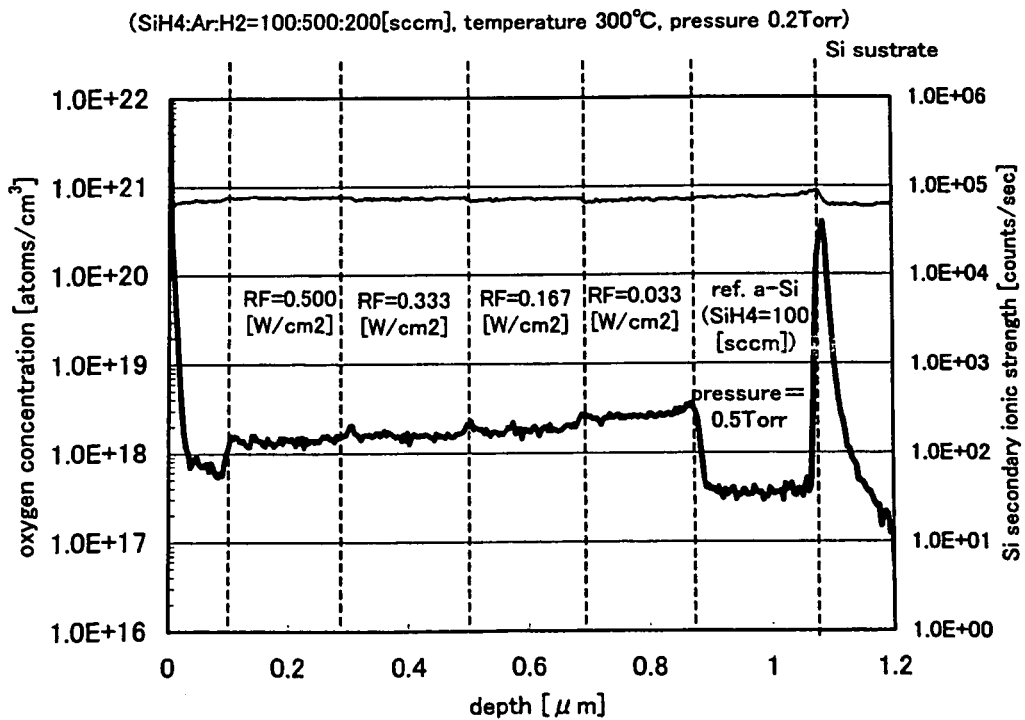
FIG. 3B is a diagram of SIMS data depicting nitrogen concentrations (Experiment 1)

The films thus laminated on the semiconductor substrate were put to the SIMS analysis. The argon concentration in the film was measured to be as shown in FIG. 2A, the fluorine concentration was measured to be as shown in FIG. 2B, the nitrogen concentration was measured to be as shown in FIG. 3A, and the oxygen concentration was measured to be as shown in FIG. 3B. From FIG. 3A, the nitrogen concentration in the film is read to be from about $1 \times 10^{16}$/cm$^3$ to about $1 \times 10^{17}$/cm$^3$. From FIG. 3B, the oxygen concentration in the film is read to be from about $4 \times 10^{17}$/cm$^3$ to about $3 \times 10^{18}$/cm$^3$. Though not diagramed, the carbon concentration in the film was from $1 \times 10^{16}$/cm$^3$ to $5 \times 10^{17}$/cm$^3$.

As will be obvious from FIGS. 2A, 2B 3A and 3B, the argon concentration in the amorphous silicon film has increased to $1 \times 10^{20}$/cm$^3$ to $1 \times 10^{21}$/cm$^3$ as a result of using hydrogen, argon and monosilane gas as the starting gases. Relying upon the plasma CVD method by using hydrogen, argon and monosilane gas as the starting gases, therefore, there can be formed an amorphous silicon film containing argon at a high concentration or, concretely speaking, at a concentration of $1 \times 10^{20}$/cm$^3$ to $1 \times 10^{21}$/cm$^3$. When the monosilane and argon gas only are used as the starting gases, on the other hand, argon was contained in the film at a concentration of about $1 \times 10^{18}$/cm$^3$, i.e., at a concentration of from about $5 \times 10^{17}$/cm$^3$ to about $2 \times 10^{18}$/cm$^3$.

By using hydrogen, argon and monosilane gas as the starting gases, further, the fluorine concentration in the amorphous silicon film has dropped down to $2 \times 10^{16}$/cm$^3$ to $8 \times 10^{16}$/cm$^3$.

Further, the argon concentration in the amorphous silicon film has increased with an increase in the RF power density. An increase in the RF power density was accompanied by almost no change in the fluorine concentration, nitrogen concentration, oxygen concentration or carbon concentration in the film.

EXPERIMENT 2

Next, the dependency of the argon concentration in the amorphous silicon film upon the pressure in the chamber was examined relying upon the plasma CVD method while changing the pressure condition in the chamber.

First, a first amorphous silicon film that served as a reference was formed on the semiconductor substrate by the plasma CVD method under the same conditions as those in Experiment 1.

Next, a second amorphous silicon film was formed maintaining a thickness of 200 nm on the first amorphous silicon film. The second amorphous silicon film was formed by the plasma CVD method by maintaining the temperature at 300° C., adjusting the pressure in the chamber to be 5.332 Pa (0.04 Torr) by the exhaust system, introducing the SiH$_4$ gas at a flow rate of 100 sccm, the argon gas at a flow rate of 100 sccm and the hydrogen gas at 50 sccm into the chamber from the gas introduction system, while conducting the electric discharge from an RF power source at a discharge frequency of 27.12 MHz and an RF power of 20 W (RF power density of 0.033 W/cm$^2$).

Next, while changing the conditions of the pressure in the chamber and the gas flow rate, there were formed, on the second amorphous silicon film, a third amorphous silicon film (pressure=4 Pa (0.03 Torr), SiH$_4$ gas flow rate of 100 sccm, argon gas flow rate of 50 sccm and hydrogen gas of 40 sccm) and a fourth amorphous silicon film (pressure=2.666 Pa (0.02 Torr), SiH$_4$ gas flow rate of 100 sccm, argon gas flow rate of 15 sccm and hydrogen gas of 12 sccm).

Figure 4A:
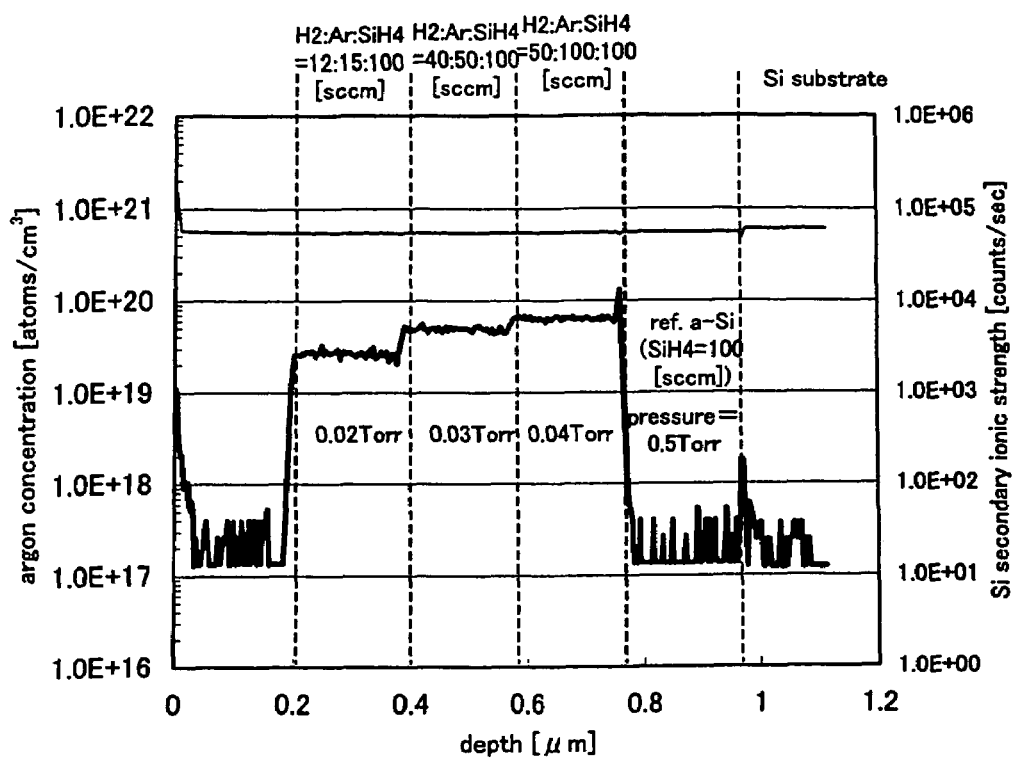
FIG. 4A is a diagram of SIMS data (dependency upon the pressure) depicting argon concentrations.
Figure 4B:
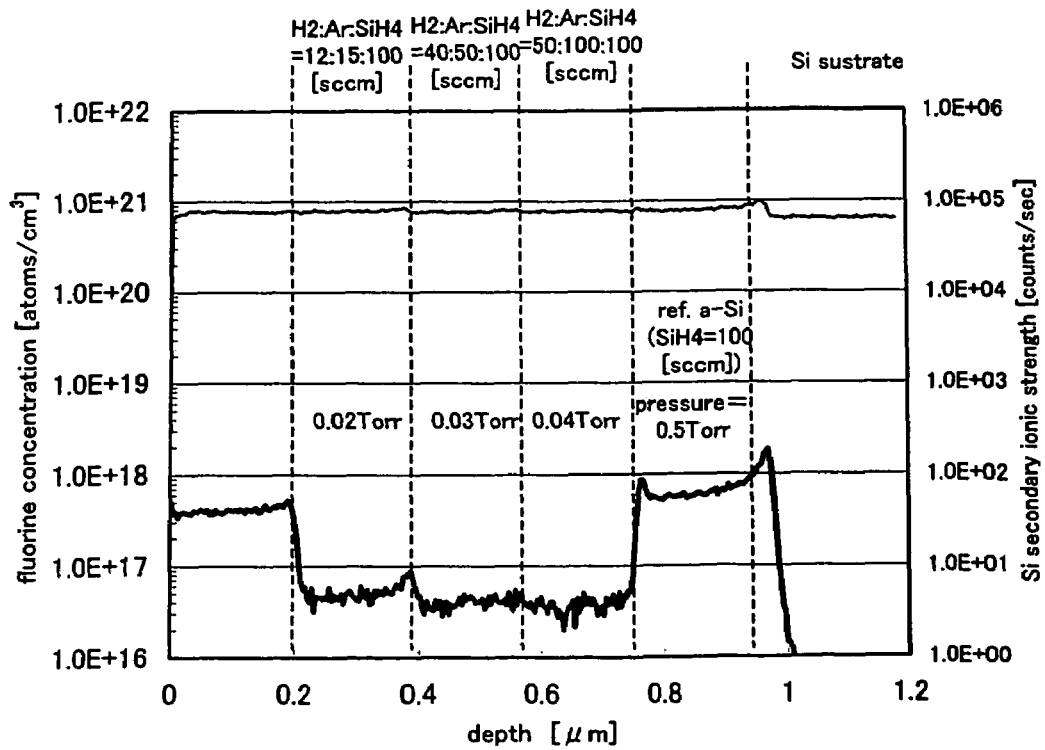
FIG. 4B is a diagram of SIMS data depicting fluorine concentrations (Experiment 2)
Figure 5A:
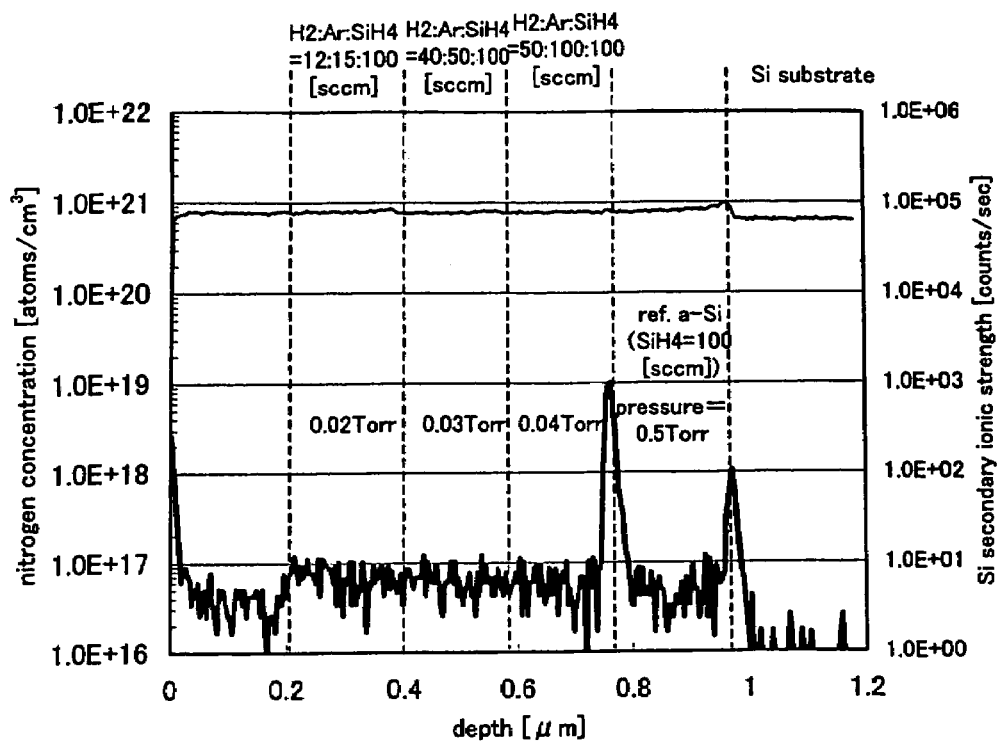
FIG. 5A is a diagram of SIMS data depicting oxygen concentrations.
Figure 5B:
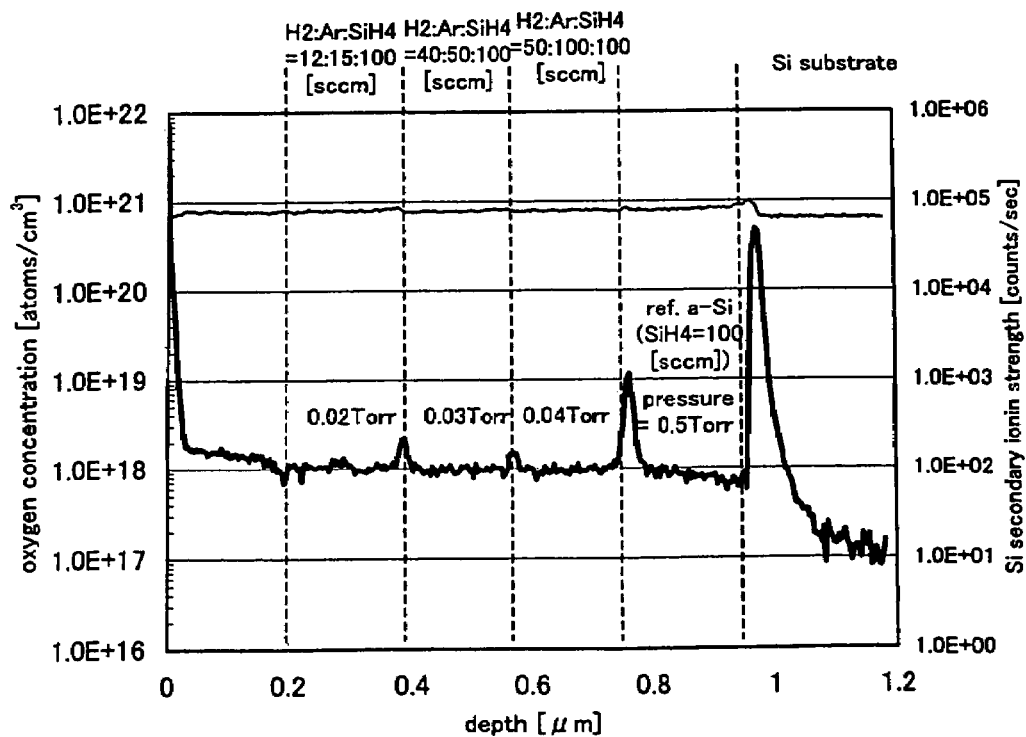
FIG. 5B is a diagram of SIMS data depicting nitrogen concentrations (Experiment 2)

The films thus laminated on the semiconductor substrate were put to the SIMS analysis. The argon concentration in the film was measured to be as shown in FIG. 4A, the fluorine concentration was measured to be as shown in FIG. 4B, the nitrogen concentration was measured to be as shown in FIG. 5A, and the oxygen concentration was measured to be as shown in FIG. 5B. The carbon concentration was from $1 \times 10^{16}$/cm$^3$ to $5 \times 10^{17}$/cm$^3$.

As will be obvious from FIGS. 4A, 4B, 5A and 5B, the argon concentration in the amorphous silicon film has decreased as the pressure was decreased, i.e., as the degree of vacuum was increased. A decrease in the pressure was accompanied by almost no change in the fluorine concentration, nitrogen concentration, oxygen concentration or carbon concentration in the film.

EXPERIMENT 3

Described below is the quality of the amorphous silicon film formed by the plasma CVD method by using the monosilane, argon element and hydrogen as the starting gases.

Figure 16:
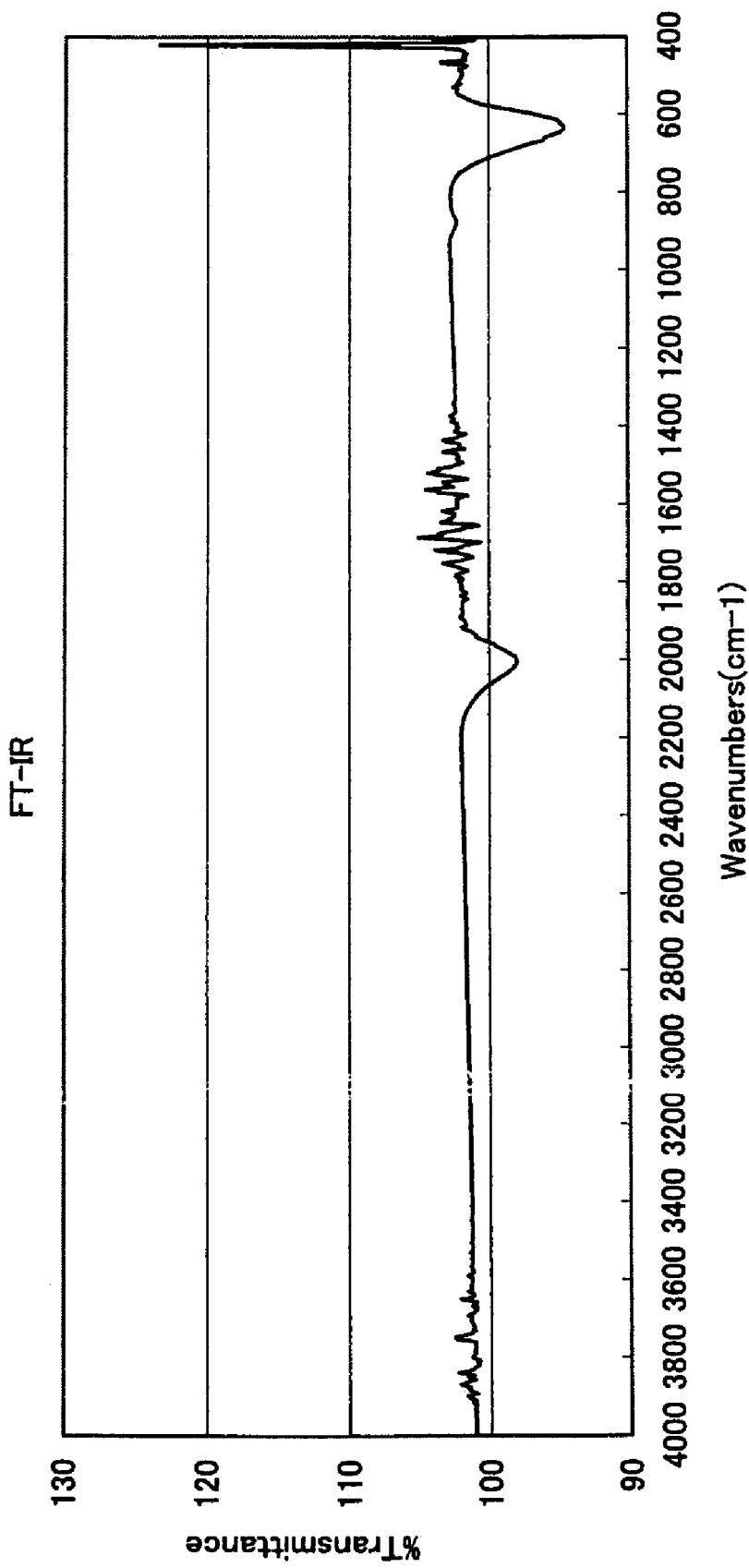
FIG. 16 is a diagram showing spectral data by an FT-IR method.

FIG. 16 is a diagram showing spectral data obtained from the amorphous silicon film formed by using the monosilane, argon element and hydrogen as the starting gases by the Fourier transform infrared ray spectral method (FT-IR method). In FIG. 16, a peak of Si—Si bond is seen at a wave number of 640/cm and another peak is seen at a wave number of 2020/cm. It has been said that the wave number of 2000/cm corresponds to a peak of Si—H bond and a wave number of 2100/cm corresponds to a peak of Si—$H_2$ bond. It can be said that the peak at the wave number of 2020/cm in FIG. 16 is due chiefly to the Si—H bond and to a small amount of the Si—$H_2$ bond.

DESCRIPTION OF THE PREFERRED EMBODIMENTS

Embodiments of the present invention will now be described.

Embodiment 1

A procedure for producing a typical TFT according to the invention will now be briefly described with reference to FIGS. 1A to 1G. Described here is an example of using, as a gettering site, a semiconductor film containing a rare gas element and having an amorphous structure of the present invention.

In FIG. 1A, reference numeral 10 denotes a substrate having an insulating surface, 11 denotes an insulating film that serves as a blocking layer, and 12 denotes a semiconductor film having an amorphous structure.

In FIG. 1A, the substrate 10 may be a glass substrate, a quartz substrate or a ceramic substrate. There may be further used a silicon substrate, a metal substrate or a stainless steel substrate on which the surface is formed an insulating film. There may be further used a plastic substrate having a heat resistance capable of withstanding the treatment temperature in the steps.

Referring to FIG. 1A, first, on the substrate 10 is formed an underlying insulating film 11 such as silicon oxide film, silicon nitride film or silicon oxynitride film (SiOxNy). Typically, the underlying insulating film 11 is of a two-layer structure, a first silicon oxynitride film being formed maintaining a thickness of 50 to 100 nm by using $SiH_4$, $NH_3$ and $N_2O$ as reaction gases, and a second silicon oxynitride film being formed thereon maintaining a thickness of 100 to 150 nm by using $SiH_4$ and $N_2O$ as reaction gases. It is further desired that a first layer of the underlying insulating film 11 is a silicon nitride film (SiN film) having a thickness of not larger than 10 nm or is a second silicon oxynitride film (SiNxOy film (x>>y)). During the gettering, nickel tends to migrate into a region where the oxygen concentration is high. Therefore, it is very meaningful that the underlying insulating film in contact with the semiconductor film is the silicon nitride film. There may be further employed a three-layer structure by successively laminating a first silicon oxynitride film, a second silicon oxynitride film and a silicon nitride film.

Next, on the underlying insulating film is formed a first semiconductor film 12 having an amorphous structure. The first semiconductor film 12 is formed of semiconductor material comprising chiefly silicon. Typically, an amorphous silicon film or an amorphous silicon-germanium film is formed maintaining a thickness of 10 to 100 nm by a plasma CVD method, a reduced-pressure CVD method or a sputtering method. To obtain a semiconductor film having a good crystalline structure through the subsequent crystallization, it is desired that the concentration of impurities such as oxygen and nitrogen contained in the first semiconductor film 12 having amorphous structure is not higher than $5\times10^{18}/cm^3$ (concentration of atoms as measured by the secondary ion mass analytical method (SIMS)). These impurities serve as a factor of hindering the subsequent crystallization. Even after the crystallization, the impurities become a cause of increasing the density of trapping centers and recombination centers. It is therefore desired to use a CVD apparatus designed for ultra-high vacuum treatment in which the interior of the reaction chamber is mirror-surface-treated (polished in an electric field) and is equipped with an oil-free evacuation system, in addition to using a highly pure material gas.

Then, the first semiconductor film 12 having an amorphous structure is crystallized by using a technology disclosed in Japanese Patent Laid-Open No. 8-78329. The technology of this publication is to form a semiconductor film having a crystalline structure by selectively adding a metal element to the amorphous silicon film to assist the crystallization, followed by heating, the semiconductor film having the crystalline structure spreading from the regions where the metal element is added. First, onto the surface of the first semiconductor film 12 having amorphous structure, there is applied, by using a spinner, a solution of nickel acetate containing 1 to 100 ppm of a metal element (nickel here) on the basis of weight which exhibits a catalytic function for promoting the crystallization to thereby form a nickel-containing layer 13 (FIG. 1B). In addition to the method of application, the nickel-containing layer 13 can be formed by any other method such as a sputtering method, a vaporization method or a method of forming a very thin film by the treatment with plasma. Though there was exemplified the application on the whole surfaces, the nickel-containing layer may be selectively formed by forming a mask.

Next, the heat treatment is conducted to effect the crystallization. In this case, a silicide is formed in a portion of the semiconductor film to where the metal element is in contact to assist the crystallization of the semiconductor, and the crystallization proceeds with the silicide as a nucleus. Thus, there is formed a first semiconductor film 14 having the crystalline structure as shown in FIG. 1C. It is desired that the oxygen concentration in the first semiconductor film 14 after the crystallization is not larger than $5\times10^{18}/cm^3$. Here, after the heat treatment (450° C., 1 hour) for dehydrogenation, the heat treatment is conducted (550 to 650° C., 4 to 24 hours) for crystallization. When the crystallization is conducted by the irradiation with intense light, it is allowable to use any one of infrared ray, visible light or ultraviolet ray, or a combination thereof. Typically, there is used light emitted from a halogen lamp, a metal halide lamp, a xenon arc lamp, a carbon arc lamp, a high-pressure sodium lamp or a high-pressure mercury lamp. The source of light is turned on for 1 to 60 seconds, desirably, for 30 to 60 seconds, repetitively from 1 to 10 times, so that the semiconductor film is instantaneously heated at up to about 600 to about 1000° C. As required, the heat treatment may be conducted to release hydrogen contained in the first semiconductor film 14 having an amorphous structure prior to the irradiation with intense light. It is further allowable to effect the crystallization by conducting the heat treatment and the irradiation with intense light simultaneously. By taking the productivity into consideration, it is desired that the crystallization is effected by the irradiation with intense light.

In the thus obtained first semiconductor film 14 is remaining the metal element (nickel here). The metal element is remaining at an average concentration in excess of $1\times10^{19}/$ cm³ though it may not be homogeneously distributed in the film. Even in this state, it is allowable to form the TFTs as well as various other semiconductor elements. The metal element, however, is removed by a method described later.

Then, in order to increase the degree of crystallization (ratio of crystal components in the whole volume of the film) and to fix the defects remaining in the crystalline particles, it is desired to irradiate the first semiconductor film 14 having the crystalline structure with a laser beam. When irradiated with the laser beam, a thin oxide film (not shown) is formed on the surface. As the laser beam, there is used an excimer laser beam having a wavelength of not longer than 400 nm, second harmonics or third harmonics of a YAG laser. It is also allowable to apply second harmonics to fourth harmonics of a fundamental wave by using a continuously oscillating laser (YAG laser, $YVO_4$ laser, YLF laser, $YAlO_3$ laser, glass laser, ruby laser, alexandrite laser, or Ti:sapphire laser). Typically, there may be applied second harmonics (532 nm) or third harmonics (355 nm) of the Nd:$YVO_4$ laser (fundamental wave, 1064 nm). When the continuously oscillating laser is used, a laser beam emitted from the continuously oscillating $YVO_4$ laser of an output of 10 W is converted into harmonics through a nonlinear optical element. Or, there may be employed a method of emitting harmonics by incorporating the $YVO_4$ crystals and the nonlinear optical element in the resonator. Desirably, a laser beam of a rectangular shape or an oval shape is formed on the surface of irradiation by the optical system, and is permitted to fall on an object to be treated. The shape (laser spot) of the laser beam on the surface of irradiation is set by a beam-forming means in the optical system to assume an oval shape having a short diameter of 3 to 100 µm and a long diameter of not smaller than 100 µm. Instead of the oval shape, the laser beam may assume a rectangular shape with a short side being 3 to 100 µm in length and a long side being not shorter than 100 µm. The above-mentioned shape is set to be the rectangular shape or the oval shape from such a standpoint that the surface of the substrate is efficiently annealed with the laser beam. Here, the length of the long diameter (or long side) is set to be not shorter than 100 µm from such a standpoint that when the laser beam has an energy density adapted to the laser annealing, then, the operator may suitably determine the length of the long diameter (or long side). In this case, the energy density must be from about 0.01 to about 100 MW/cm² (preferably, from 0.1 to 10 MW/cm²). The semiconductor film may be moved relative to the laser beam at a speed of from about 10 to about 2000 cm/s so as to be irradiated with the laser beam.

The oxide film formed by the irradiation with the laser beam after the crystallization is not enough. Therefore, the oxide film (called chemical oxide) is formed by using an ozone-containing aqueous solution (typically, ozone water) to thereby form a barrier layer 15 of oxide films having a total thickness of from 1 to 10 nm, and a second semiconductor film 16 containing a rare gas element is formed on the barrier layer 15 (FIG. 1D). Here, the oxide film formed by irradiating the first semiconductor film 14 having the crystalline structure with the laser beam, too, is regarded to be a portion of the barrier layer. The barrier layer 15 works as an etching stopper when the second semiconductor film 16 only is to be selectively removed in a subsequent step. The chemical oxide can similarly be formed even by the treatment with an aqueous solution in which sulfuric acid, hydrochloric acid, nitric acid and hydrogen peroxide are mixed together instead of using the ozone-containing aqueous solution. The barrier layer 15 may further be formed by oxidizing the surface of the semiconductor film having the crystalline structure by generating ozone by the irradiation with ultraviolet rays in an oxidizing atmosphere. The barrier layer 15 may further be formed by depositing an oxide film maintaining a thickness of about 1 to 10 nm by the plasma CVD method, by the sputtering method or by the vaporization method. When the barrier layer is formed by the plasma CVD method, sputtering method or vaporization method, it is desired that the barrier layer is formed after having washed the surface of the semiconductor film having the crystalline structure and after having removed the spontaneously oxidized film or the oxide film formed by the irradiation with the laser beam.

When the plasma CVD method is used for the formation of the barrier layer, there are used the silane gas (monosilane, disilane or trisilane) and a nitrogen oxide gas (gas that can be expressed by NOx) as starting gases, and the film is formed by the pulse oscillation. Namely, the silicon oxynitride film is formed in a thickness of not larger than 10 nm and, preferably, not larger than 5 nm by using, as starting gases, monosilane ($SiH_4$) and nitrous oxide ($N_2O$), or TEOS gas and $N_2O$, or TEOS gas, $N_2O$ and $O_2$. As compared to the oxide film (called chemical oxide) obtained by using the ozone-containing aqueous solution (typically, ozone water) and the oxide film formed by oxidizing the surface of the semiconductor film having the crystalline structure by generating ozone by the irradiation with ultraviolet rays in an oxidizing atmosphere, the silicon oxynitride film is highly intimately adhered to the first semiconductor film having the crystalline structure and does not develop peeling in a subsequent step (of forming the second semiconductor film). In order to further improve the intimate adhesion, the treatment with argon plasma may be effected prior to forming the barrier layer. In the step of gettering, further, the silicon oxynitide film having a thickness lying within the above range permits the metal element to pass through the barrier layer so as to migrate into the gettering site.

When the plasma CVD method is used for forming the barrier layer, further, the second semiconductor film containing the rare gas element and the barrier layer can be formed without coming in contact with the open air. Besides, they can be continuously formed in the same chamber maintaining a high throughput.

The barrier layer 15 can be further formed by heating a clean oven at about 200 to 350° C. to form a thin oxide film. The barrier layer 15 formed by any one of the above methods or by a combination of these methods must possess a film quality or a film thickness which permits nickel in the first semiconductor film to migrate into the second semiconductor film in the subsequent gettering. In this specification, the barrier layer is the one having a film quality or a film thickness which permits the metal element to pass therethrough in the step of gettering, and works as an etching stopper in the step of removing the layer that becomes the gettering site.

Here, the second semiconductor film 16 containing the rare gas element is formed by the plasma CVD method to form the gettering site. As the rare gas element, there can be used any one or a plurality of those selected from helium (He), neon (Ne), argon (Ar), krypton (Kr) and xenon (Xe). Among them, it is desired to use argon (Ar) which is a cheaply available gas. Here, use is made of the monosilane, argon and hydrogen as the starting gases to form, by the plasma CVD method, the second semiconductor film which contains argon at a concentration of from $1\times10^{18}/cm^3$ to $1\times10^{22}/cm^3$, preferably, from $1\times10^{20}/cm^3$ to $1\times10^{21}/cm^3$ to obtain gettering effect. In the second semiconductor film, the fluorine concentration is lowered down to $2 \times 10^{16}/cm^3$ to $8 \times 10^{16}/cm^3$, and the hydrogen concentration assumes a relatively small value, too.

The rare gas element ions forming an inert gas are contained in the film because of two reasons. One reason is to form a dangling bond to impart distortion to the semiconductor film. Another reason is to impart distortion among the lattices of the semiconductor film. Distortion is imparted among the lattices of the semiconductor film to a conspicuous degree when there is used an element such as argon (Ar), krypton (Kr) or xenon (Xe) having an atomic radius larger than that of silicon. With the rare gas element being contained in the film, further, not only the lattices are distorted but also asymmetrical bonds are formed contributing to obtaining the gettering action.

Next, the heat treatment is effected to conduct the gettering for decreasing the concentration of, or for removing, the metal element (nickel) contained in the first semiconductor element (FIG. 1E). The gettering is conducted by the irradiation with intense light or by the heat treatment. Due to the gettering, the metal element migrates in the direction of arrows in FIG. 1E (i.e., in the direction from the substrate side toward the surface of the second semiconductor film), and the metal element contained in the first semiconductor layer 14 covered with the barrier layer 15 is removed, or the concentration of the metal element therein decreases. The distance which the metal element migrates during the gettering needs at least be roughly the thickness of the first semiconductor film, and the gettering is accomplished within a relatively short period of time. Here, nickel is all migrated into the second semiconductor film 16 so will not to be segregated in the first semiconductor film 14; i.e., almost no nickel is contained in the first semiconductor film 14. Namely, the gettering is conducted to a sufficient degree so that the nickel concentration in the film becomes not larger than $1 \times 10^{18}/cm^3$ or, desirably, not larger than $1 \times 10^{17}/cm^3$.

Depending upon the conditions of the heat treatment for gettering or depending upon the thickness of the second semiconductor film, the second semiconductor film may often be partly crystallized. When the second semiconductor film is crystallized, there results a decrease in the dangling bond, in the lattice distortion and in the asymmetric bond, and the gettering effect decreases. Desirably, therefore, the heat treatment condition and the thickness of the second semiconductor film are such that the second semiconductor film is not crystallized. In any way, the second semiconductor film, i.e., the amorphous silicon film containing the rare gas element, is less likely to be crystallized than the amorphous silicon film without containing rare gas element, and is best suited as the gettering site.

Depending upon the heat treatment conditions for gettering, the degree of crystallization of the first semiconductor film can be enhanced simultaneously with the gettering to fix defects left in the crystalline particles, i.e., to improve the crystallinity.

In this specification, the gettering stands for that the metal element in the region to be gettered (first semiconductor film here) is released due to heat energy and migrates into the gettering site due to diffusion. Therefore, the gettering is dependent upon the treatment temperature and proceeds within short periods of time as the temperature rises.

In the case of the treatment by the irradiation with intense light, the source of light for heating is turned on for 1 to 60 seconds and, preferably, for 30 to 60 seconds, and is repeated 1 to 10 times and, preferably, 2 to 6 times. The intensity of light of the source of light may be arbitrarily selected but is so selected that the semiconductor film is heated instantaneously at 600 to 1000° C. and, preferably, at about 700 to about 750° C.

In the case of the heat treatment, the heat treatment is conducted in a nitrogen atmosphere at 450 to 800° C. for 1 to 24 hours, for example, at 550° C. for 14 hours. Instead of the heat treatment, intense light may be irradiated.

Next, with the barrier layer 15 as an etching stopper, the second semiconductor film designated at 16 only is selectively removed. Thereafter, the barrier layer 15 is removed, and the first semiconductor film 14 is patterned relying upon the known patterning technology to form a semiconductor layer 17 of a desired shape (FIG. 1F). As a method of selectively etching the second semiconductor film only, there can be employed dry-etching based on $ClF_3$ without using plasma or wet-etching using an alkali solution such as an aqueous solution containing hydrazine or tetraethylammonium hydroxide (chemical formula, $(CH_3)_4NOH$). Even after the second semiconductor film is removed, the nickel concentration in the surface of the barrier layer will be measured by TXRF to be still high. It is therefore desired to remove the barrier layer by using an etchant containing hydrofluoric acid. After the barrier layer is removed, further, it is desired to form a thin oxide film on the surface with ozone water prior to forming a mask of a resist.

Next, the surface of the semiconductor layer is washed with the etchant containing hydrofluoric acid, and an insulating film comprising chiefly silicon is formed to form a gate-insulating film 18. It is desired that the washing of the surface and the formation of the gate-insulating film are continuously conducted without being exposed to the open air.

After the surface of the gate-insulating film 18 is washed, a gate electrode 19 is formed. Then, an impurity element (P, As, etc.) is added or phosphorus, in this case, is added to impart the n-type to the semiconductor thereby to form a source region 20 and a drain region 21. After the impurity element is added, the heat treatment is conducted, intense light is irradiated or laser beam is irradiated to activate the impurity element. Simultaneously with the activation, further, damage to the gate-insulating film due to plasma is recovered or damage to the interface between the gate-insulating film and the semiconductor layer due to plasma is recovered. In particular, it is very effective if the impurity element is activated by being irradiated with the second harmonics of the YAG laser from the front surface or from the back surface in an atmosphere of room temperature through up to 300° C. The YAG laser is a preferred activating means since it requires little maintenance.

In the subsequent step, an interlayer-insulating film 23 is formed, contact holes reaching the source region and the drain region are formed after the hydrogenation, and a source electrode 24 and a drain electrode 25 are formed to finish the TFT (n-channel TFT)(FIG. 1G).

The channel-forming region 22 of the thus obtained TFT contains the metal element at a concentration of smaller than $1 \times 10^{17}/cm^3$.

This invention is not limited to the TFT structure of FIG. 1G only but may, as required, assume a low-density drain (LDD: lightly doped drain) structure having an LDD region between the channel-forming region and the drain region (or source region). In this structure, a region to which an impurity element is added at a low concentration is provided between the channel-forming region and the source region or the drain region that is formed by adding an impurity element at a high concentration. This region is called LDD region. There may be further employed a so-called GOLD (gate-drain overlapped LDD) structure in which the LDD region is overlapped on the gate electrode through the gate-insulating film.

Though the description here has dealt with the n-channel TFT, it needs not be pointed out that a p-channel TFT can also be formed by using a p-type impurity element instead of the n-type impurity element.

Further, though the description here has dealt with the top gate-type TFT, the invention can be applied irrespective of the TFT structure. For example, the invention can be applied to the bottom gate-type (reversely staggered) TFT and to the forwardly staggered TFT.

Embodiment 2

In this embodiment, a semiconductor film containing the rare gas element and having an amorphous structure of the invention is used as the active layer of the TFT.

First, a gate electrode is formed on a substrate having an insulating surface, a gate-insulating film is formed to cover the gate electrode, and a first semiconductor film containing the rare gas element and having an amorphous structure of the invention is formed on the gate-insulating film. The starting gases used here are monosilane, argon and hydrogen and whereby the first semiconductor film having an amorphous structure is formed by the plasma CVD to contain argon at a concentration of from $1 \times 10^{18}/cm^3$ to $1 \times 10^{22}/cm^3$, preferably, from $1 \times 10^{20}/cm^3$ to $1 \times 10^{21}/cm^3$, fluorine at a concentration of from $2 \times 10^{16}/cm^3$ to $8 \times 10^{16}/cm^3$, and hydrogen at a relatively low concentration. Then, a second semiconductor film containing an impurity element of one type of electric conduction (n-type or p-type) is laminated thereon. Then, unnecessary portions of the first semiconductor film having amorphous structure are removed by etching except the portions that become an active layer. Then, an electrically conducting film is formed on the whole surface; portions of the electrically conducting film and of the second semiconductor film containing an impurity element of one type of electric conduction (n-type or p-type) are removed, thereby to form a source region and a drain region of the semiconductor film and, at the same time, to form a drain wiring and a source wiring of the electrically conducting film. Further, the first semiconductor film is partly removed to fabricate the TFT of a channel-etched bottom-gate structure. Upon being provided with a pixel electrode, the TFT can be used for a pixel portion in a liquid crystal display device.

Further, not being limited to the above TFT called amorphous silicon TFT, the invention can be further applied to the active layer of the TFT called polysilicon TFT.

In this case, the first semiconductor film containing the rare gas element and having an amorphous structure of the invention is used as the first semiconductor film 12 having an amorphous structure that is formed on the underlying insulating film shown in the Embodiment 1. A semiconductor having a crystalline structure is formed by effecting the crystallization based on the crystallization technology (solid-phase growing method, laser crystallization method or solid-phase growing method based on the heat treatment using a metal element as a catalyst), and is patterned so as to use it as the active layer of the TFT. The semiconductor film having an amorphous structure of the invention is advantageously crystallized since it contains hydrogen and fluorine at decreased concentrations. The starting gases used here are monosilane, argon and hydrogen and whereby the first semiconductor film having an amorphous structure is formed by the plasma CVD to contain argon at a concentration of from $1 \times 10^{18}/cm^3$ to $1 \times 10^{22}/cm^3$ and, preferably, from $1 \times 10^{20}/cm^3$ to $1 \times 10^{21}/cm^3$.

When the crystallization is to be effected by using, for example, a laser, the first semiconductor film containing the rare gas element and nitrogen and having an amorphous structure of this invention is formed on the substrate having an insulating surface, followed by the crystallization with the laser.

The laser beam that is used may be that of a pulse-oscillation type or continuously light-emitting excimer laser, a YAG laser, a $YVO_4$ laser, a YLF laser, a $YAlO_3$ layer, a glass laser, a ruby laser, an alexandrite laser or a Ti:sapphire laser. When these lasers are used, the laser beam emitted from the laser oscillator is linearly collected through an optical system and is projected onto the semiconductor film. The conditions of crystallization are suitably selected by the operator. When the pulse-oscillation type excimer laser is used, the pulse oscillation frequency is selected to be 30 Hz and the laser energy density is selected to be from 100 to 400 mJ/cm$^2$ (typically from 200 to 300 mJ/cm$^2$). When the pulse-oscillation type YAG laser or $YVO_4$ laser is used, further, the second harmonics or the third harmonics are used, the pulse oscillation frequency is selected to be 1 to 10 kHz, and the laser energy density is selected to be 300 to 600 mJ/cm$^2$ (typically, 350 to 500 mJ/cm$^2$). The laser beam linearly focused to possess a width of 100 to 1000 μm, e.g., 400 μm, is projected onto the whole surface of the substrate, the linear laser beam being overlapped at a ratio (overlapping ratio) of 80 to 98%.

When the continuous oscillation-type laser as represented by the $YVO_4$ laser is used, the laser beam emitted from the continuously oscillating $YVO_4$ laser of an output of 10 W is converted into harmonics (second harmonics to fourth harmonics) through a nonlinear optical element. There can be also employed a method of emitting harmonics by incorporating $YVO_4$ crystals and a nonlinear optical element in the resonator. Preferably, the laser beam is formed through an optical system into a rectangular shape or an oval shape on the surface of irradiation, and is projected onto the object to be treated. Here, the energy density must be from about 0.01 to about 100 MW/cm$^2$ (preferably from 0.1 to 10 MW/cm$^2$). The semiconductor film may be irradiated with the laser beam while moving it at a speed of about 0.5 to 2000 cm/sec with respect to the laser beam.

Embodiment 3

The semiconductor film containing the rare gas element and having an amorphous structure of the invention can be used as a layer (peeling layer) which develops peeling inside the layer or on the interface due to the etching or upon the irradiation with the laser beam at the time of separating the elements such as TFTs from the substrate after the elements have been formed on the substrate. The peeling layer is formed on the substrate in contact therewith, and forms an insulating film and TFTs on the peeling layer.

As compared to the conventional semiconductor films having an amorphous structure, the semiconductor film containing the rare gas element and having an amorphous structure of this invention is etched at a different rate and can be used as an etching stopper in various steps of etching.

Further, the amorphous semiconductor film comprising the rare gas element of the present invention can be used as gettering site for a semiconductor film that was crystallized by a different method from the one explained in Embodiment 1 and other general semiconductor films.

The invention constituted as described above will now be described in further detail by way of working examples.

EXAMPLES

Example 1

An example of the present invention is described with reference to FIGS. 6A to 8. Here, a method of simultaneously manufacturing a pixel portion and TFTs (n-channel TFTs and a p-channel TFT) of a driver circuit provided in the periphery of the pixel portion on the same substrate is described in detail.

First, a base insulating film 101 is formed on a substrate 100, and a first semiconductor film having a crystalline structure is obtained. Then, the semiconductor film is etched to have a desired shape to form semiconductor layers 102 to 106 separated from one another in an island shape.

A glass substrate (#1737) is used as the substrate 100. For the base insulating film 101, a silicon oxynitride film 101a formed from $SiH_4$, $NH_3$, and $N_2O$ as material gases (composition ratio: Si=32%, O=27%, N=24%, H=17%) is formed with a thickness of 50 nm (preferably 10 to 200 nm) and at a film deposition temperature of 400° C. by using plasma CVD. Then, after the surface is cleaned with ozone water, an oxide film on the surface is removed by means of dilute hydrofluoric acid (dilution with 1/100). Next, a silicon hydride oxynitride film 101b formed from $SiH_4$ and $N_2O$ as material gases (composition ratio: Si=32%, O=59%, N=7%, H=2%) is formed thereon with a thickness of 100 nm (preferably 50 to 200 nm) and at a film deposition temperature of 400° C. by using plasma CVD to thereby form a lamination. Further, without exposure to an atmosphere, a semiconductor film having an amorphous structure (in this case, amorphous silicon film) is formed to have a thickness of 54 nm (preferably 25 to 80 nm) with $SiH_4$ as a film deposition gas and at a film deposition temperature of 300° C. by using plasma CVD.

In this example, the base film 101 is shown in a form of a two-layer structure, but a single layer of the insulating film or a structure in which two or more layers thereof are laminated may be adopted. Further, there is no limitation on the material of the semiconductor film. However, the semiconductor film may be preferably formed of silicon or silicon germanium ($Si_xGe_{1-x}$ (X=0.0001 to 0.02)) alloy by using a known means (sputtering, LPCVD, plasma CVD, or the like). Further, plasma CVD apparatus may be a single wafer type one or a batch type one. In addition, the base insulating film and the semiconductor film may be continuously formed in the same film formation chamber without exposure to an atmosphere.

Subsequently, after the surface of the semiconductor film having an amorphous structure is cleaned, an extremely thin oxide film with a thickness of about 2 nm is formed from ozone water on the surface. Then, in order to control a threshold value of a TFT, doping of a minute amount of impurity element (boron or phosphorous) is performed. Here, an ion doping method is used in which diborane ($B_2H_6$) is plasma-excited without mass-separation, and boron is added to the amorphous silicon film under the doping conditions: an acceleration voltage of 15 kV; a gas flow rate of diborane diluted to 1% with hydrogen of 30 sccm; and a dosage of $2\times10^{12}/cm^2$.

Then, a nickel acetate salt solution containing nickel of 10 ppm in weight is applied using a spinner. Instead of the application, a method of spraying nickel elements to the entire surface by sputtering may also be used.

Then, heat treatment is conducted to perform crystallization, thereby forming a semiconductor film having a crystalline structure. A heating process using an electric furnace or irradiation of strong light may be conducted for this heat treatment. In case of the heating process using an electric furnace, it may be conducted at 500 to 650° C. for 4 to 24 hours. Here, after the heating process (500° C. for 1 hour) for dehydrogenation is conducted, the heating process (550° C. for 4 hours) for crystallization is conducted, thereby obtaining a silicon film having a crystalline structure. Note that, although crystallization is performed by using the heating process using a furnace, crystallization may be performed by means of a lamp annealing apparatus. Also, note that, although a crystallization technique using nickel as a metal element that promotes crystallization of silicon is used here, other known crystallization techniques, for example, a solid-phase growth method and a laser crystallization method, may be used.

Next, after the oxide film on the surface of the silicon film having a crystalline structure is removed by dilute hydrofluoric acid or the like, irradiation of first laser light (XeCl: wavelength of 308 nm) for raising a crystallization rate and repairing defects remaining in crystal grains is performed in an atmosphere or in an oxygen atmosphere. Excimer laser light with a wavelength of 400 nm or less, or second harmonic wave or third harmonic wave of a YAG laser is used for the laser light. In any case, pulse laser light with a repetition frequency of approximately 10 to 1000 Hz is used, the pulse laser light is condensed to 100 to 500 $mJ/cm^2$ by an optical system, and irradiation is performed with an overlap ratio of 90 to 95%, whereby the silicon film surface may be scanned. Here, the irradiation of the first laser light is performed in an atmosphere with a repetition frequency of 30 Hz and energy density of 393 $mJ/cm^2$. Note that an oxide film is formed on the surface by the first laser light irradiation since the irradiation is conducted in an atmosphere or in an oxygen atmosphere.

Next, after the oxide film formed by the first light irradiation is removed by dilute hydrofluoric acid, second laser light irradiation is performed in a nitrogen atmosphere or in a vacuum, thereby leveling the semiconductor film surface. Excimer laser light with a wavelength of 400 nm or less, or second harmonic wave or third harmonic wave of a YAG laser is used as the laser light (second laser light). The energy density of the second laser light is made larger than that of the first laser light, preferably made larger by 30 to 60 $mJ/cm^2$. Here, the second laser light irradiation is performed with a repetition frequency of 30 Hz and energy density of 453 $mJ/cm^2$ to thereby set a P-V value of unevenness in the semiconductor film surface to 5 nm or less. In case of the second laser light irradiation, the difference in level of unevenness (P-V value: peak to valley, the difference between the maximum value and the minimum value in height) formed by the first laser light irradiation is reduced, namely, flattened. Here, the P-V value of unevenness may be observed with AFM (atomic force microscope).

Further, although the second laser light irradiation is conducted over the surface in this example, a step of selectively performing irradiation at least on a pixel portion may be adopted since the reduction of an off current particularly has an effect on a TFT of the pixel portion.

In this example, an example of planarization using the second laser light irradiation is described, however it needs not particularly be performed.

Next, the surface is processed with ozone water for 120 seconds, thereby forming a barrier layer comprised of an oxide film with a thickness of 1 to 5 nm in total.

Then, an amorphous silicon film including an argon element, which is to be the gettering site by plasma CVD shown in Embodiment 1, is formed with a thickness of 150 nm on the barrier layer.

The film deposition conditions with plasma CVD in this example are: a film deposition pressure of 26.66 Pa (0.2 Torr); a gas ($SiH_4$) flow rate of 100 sccm; a gas (Ar) flow rate of 500 sccm; are introduces from the installation system. As well as that, electric discharge is performed with electric discharge 27.12 MHz; an RF electric charge 300 W (RF power density 0.5 W/$cm^2$). Note that under the above conditions, the atomic concentration of the argon element contained in the amorphous silicon film is $1\times10^{20}$/$cm^3$ to $1\times10^{21}$/$cm^3$. Thereafter, heat treatment at 650° C. for 3 minutes is conducted using the lamp annealing apparatus to perform gettering.

Subsequently, the amorphous silicon film containing the argon element, which is the gettering site, is selectively removed with the barrier layer as an etching stopper, and then, the barrier layer is selectively removed by dilute hydrofluoric acid. Note that there is a tendency that nickel is likely to move to a region with a high oxygen concentration in gettering, and thus, it is desirable that the barrier layer comprised of the oxide film is removed after gettering.

Then, after a thin oxide film is formed from ozone water on the surface of the obtained silicon film having a crystalline structure (also referred to as polysilicon film), a mask made of resist is formed, and an etching process is conducted thereto to obtain a desired shape, thereby forming the island-like semiconductor layers 102 to 106 separated from one another. After the formation of the semiconductor layers, the mask made of resist is removed.

Then, the oxide film is removed with the etchant containing hydrofluoric acid, and at the same time, the surface of the silicon film is cleaned. Thereafter, an insulating film containing silicon as its main constituent, which becomes a gate insulating film 107, is formed. In this example, a silicon oxynitride film (composition ratio: Si=32%, O=59%, N=7%, H=2%) is formed with a thickness of 115 nm by plasma CVD.

Next, as shown in FIG. 6A, on the gate insulating film 107, a first conductive film 108a with a thickness of 20 to 100 nm and a second conductive film 108b with a thickness of 100 to 400 nm are formed in lamination. In this example, a 50 nm thick tantalum nitride film and a 370 nm thick tungsten film are sequentially laminated on the gate insulating film 107.

As a conductive material for forming the first conductive film and the second conductive film, an element selected from the group consisting of Ta, W, Ti, Mo, Al and Cu, or an alloy material or compound material containing the above element as its main constituent is employed. Further, a semiconductor film typified by a polycrystalline silicon film doped with an impurity element such as phosphorous, or an AgPdCu alloy may be used as the first conductive film and the second conductive film. Further, the present invention is not limited to a two-layer structure. For example, a three-layer structure may be adopted in which a 50 nm thick tungsten film, an alloy film of aluminum and silicon (Al—Si) with a thickness of 500 nm, and a 30 nm thick titanium nitride film are sequentially laminated. Moreover, in case of a three-layer structure, tungsten nitride may be used in place of tungsten of the first conductive film, an alloy film of aluminum and titanium (Al—Ti) may be used in place of the alloy film of aluminum and silicon (Al—Si) of the second conductive film, and a titanium film may be used in place of the titanium nitride film of the third conductive film. In addition, a single layer structure may also be adopted.

Next, as shown in FIG. 6B, masks 110 to 115 are formed by an exposure step, and a first etching process for forming gate electrodes and wirings is performed. The first etching process is performed with first and second etching conditions. An ICP (inductively coupled plasma) etching method may be preferably used for the etching process. The ICP etching method is used, and the etching conditions (an electric energy applied to a coil-shape electrode, an electric energy applied to an electrode on a substrate side, a temperature of the electrode on the substrate side, and the like) are appropriately adjusted, whereby a film can be etched to have a desired taper shape. Note that chlorine-based gases typified by $Cl_2$, $BCl_3$, $SiCl_4$, and $CCl_4$, fluorine-based gases typified by $CF_4$, $SF_6$, and $NF_3$, and $O_2$ can be appropriately used as etching gases.

In this example, RF (13.56 MHz) power of 150 W is applied also to the substrate (sample stage) to substantially apply a negative self-bias voltage. The electrode area to the substrate side is 12.5 cm×12.5 cm, and the coil-shape electrode area (quartz disc formed coil is described here) is 25 cm diameter disc. Under the first etching conditions, an etching rate to W is 200.39 nm/min, an etching rate to TaN is 80.32 nm/min, and a selection ratio of W to TaN is about 2.5. Further, with the first etching conditions, a taper angle of W is approximately 26°. Thereafter, the first etching conditions are changed to the second etching conditions without removing the masks 110 to 115 made of resist. $CF_4$ and $Cl_2$ are used as etching gases, the flow rate of the gases is set to 30/30 sccm, and RF (13.56 MHz) power of 500 W is applied to a coil-shape electrode with a pressure of 1 Pa to generate plasma, thereby performing etching for about 30 seconds. RF (13.56 MHz) power of 20 W is also applied to the substrate side (sample stage) to substantially apply a negative self-bias voltage. Under the second etching conditions in which $CF_4$ and $Cl_2$ are mixed, both the W film and the TaN film are etched at the same level. With the second etching conditions, an etching rate to W is 58.97 nm/min, and an etching rate to TaN is 66.43 nm/min. Note that an etching time may be increased by 10 to 20% in order to conduct etching without remaining residue on the gate insulating film.

In the first etching process as described above, the shape of the mask made of resist is made appropriate, whereby the end portion of the first conductive layer and the end portion of the second conductive layer each have a tapered shape due to the effect of the bias voltage applied to the substrate side. The angle of the tapered portion is sufficiently set to 15° to 45°.

Thus, first shape conductive layers 117 to 121 composed of the first conductive layer and the second conductive layer (first conductive layers 117a to 121a and second conductive layers 117b to 121b) are formed by the first etching process. The insulating film 107 that becomes the gate insulating film is etched by approximately 10 to 20 nm, and becomes a gate insulating film 116 in which regions which are not covered by the first shape conductive layers 117 to 121 are thinned.

Next, a second etching process is conducted without removing the masks made of resist. (FIG. 6C) Here, $SF_6$, $Cl_2$ and $O_2$ are used as etching gases, the flow rate of the gases is set to 24/12/24 sccm, and RF (13.56 MHz) power of 700 W is applied to a coil-shape electrode with a pressure of 1.3 Pa to generate plasma, thereby performing etching for 25 seconds. RF (13.56 MHz) power of 10 W is also applied to the substrate side (sample stage) to substantially apply a negative self-bias voltage. In the second etching process, an etching rate to W is 227.3 nm/min, an etching rate to TaN is 32.1 nm/min, a selection ratio of W to TaN is 7.1, an etching rate to SiON that is the insulating film 116 is 33.7 nm/min, and a selection ration of W to SiON is 6.83. In the case where $SF_6$ is used as the etching gas, the selection ratio with respect to the insulating film 116 is high as described above. Thus, reduction in the film thickness can be suppressed. In this example, the film thickness of the insulating film 116 is reduced by only about 8 nm.

By the second etching process, the taper angle of W becomes 70°. By the second etching process, second conductive layers 124b to 129b are formed. On the other hand, the first conductive layers are hardly etched to become first conductive layers 124a to 129a. Note that the first conductive layers 124a to 129a have substantially the same size as the first conductive layers 117a to 121a. In actuality, the width of the first conductive layer may be reduced by approximately 0.3 μm, namely, approximately 0.6 μm in the total line width in comparison with before the second etching process. In FIGS. 6B and 6C, there is almost no change in size of the taper of the first conductive layer. However, the taper of the first conductive layer is changed according to the wiring width because the line width of the taper portion depends on the wiring width.

Further, in the case where, instead of the two-layer structure, the three-layer structure is adopted in which a 50 nm thick tungsten film, an alloy film of aluminum and silicon (Al—Si) with a thickness of 500 nm, and a 30 nm thick titanium nitride film are sequentially laminated, under the first etching conditions of the first etching process in which: $BCl_3$, $Cl_2$ and $O_2$ are used as material gases; the flow rate of the gases is set to 65/10/5 (sccm); RF (13.56 MHz) power of 300 W is applied to the substrate side (sample stage); and RF (13.56 MHz) power of 450 W is applied to a coil-shape electrode with a pressure of 1.2 Pa to generate plasma, etching is performed for 117 seconds. As to the second etching conditions of the first etching process, $CF_4$, $Cl_2$ and $O_2$ are used, the flow rage of the gases is set to 25/25/10 sccm, RF (13.56 MHz) power of 20 W is also applied to the substrate side (sample stage); and RF (13.56 MHz) power of 500 W is applied to a coil-shape electrode with a pressure of 1 Pa to generate plasma. With the above conditions, it is sufficient that etching is performed for about 30 seconds. In the second etching process, $BCl_3$ and $Cl_2$ are used, the flow rate of the gases are set to 20/60 sccm, RF (13.56 MHz) power of 100 W is applied to the substrate side (sample stage), and RF (13.56 MHz) power of 600 W is applied to a coil-shape electrode with a pressure of 1.2 Pa to generate plasma, thereby performing etching.

Next, the masks made of resist are removed, and then, a first doping process is conducted to obtain the state of FIG. 6D. The doping process may be conducted by ion doping or ion implantation. Ion doping is conducted with the conditions of a dosage of $1.5×10^{14}$ atoms/cm$^2$ and an accelerating voltage of 60 to 100 keV. As an impurity element imparting n-type conductivity, phosphorous (P) or arsenic (As) is typically used. In this case, first conductive layers and second conductive layers 124 to 128 become masks against the impurity element imparting n-type conductivity, and first impurity regions 130 to 134 are formed in a self-aligning manner. The impurity element imparting n-type conductivity is added to the first impurity regions 130 to 134 in a concentration range of $1×10^{16}$ to $1×10^{17}$/cm$^3$. Here, the region having the same concentration range as the first impurity region is also called an n$^{--}$ region.

Note that although the first doping process is performed after the removal of the masks made of resist in this example, the first doping process may be performed without removing the masks made of resist. In FIG. 6D, the size of the taper of the first conductive layer is the same, however, the size of the taper of the first conductive layer is actually changed according to the wiring width. Thus, when the plural wirings have different wiring width are formed on the same substrate, the width of region to be doped is different from each other.

Figures 7A, 7B, 7C:
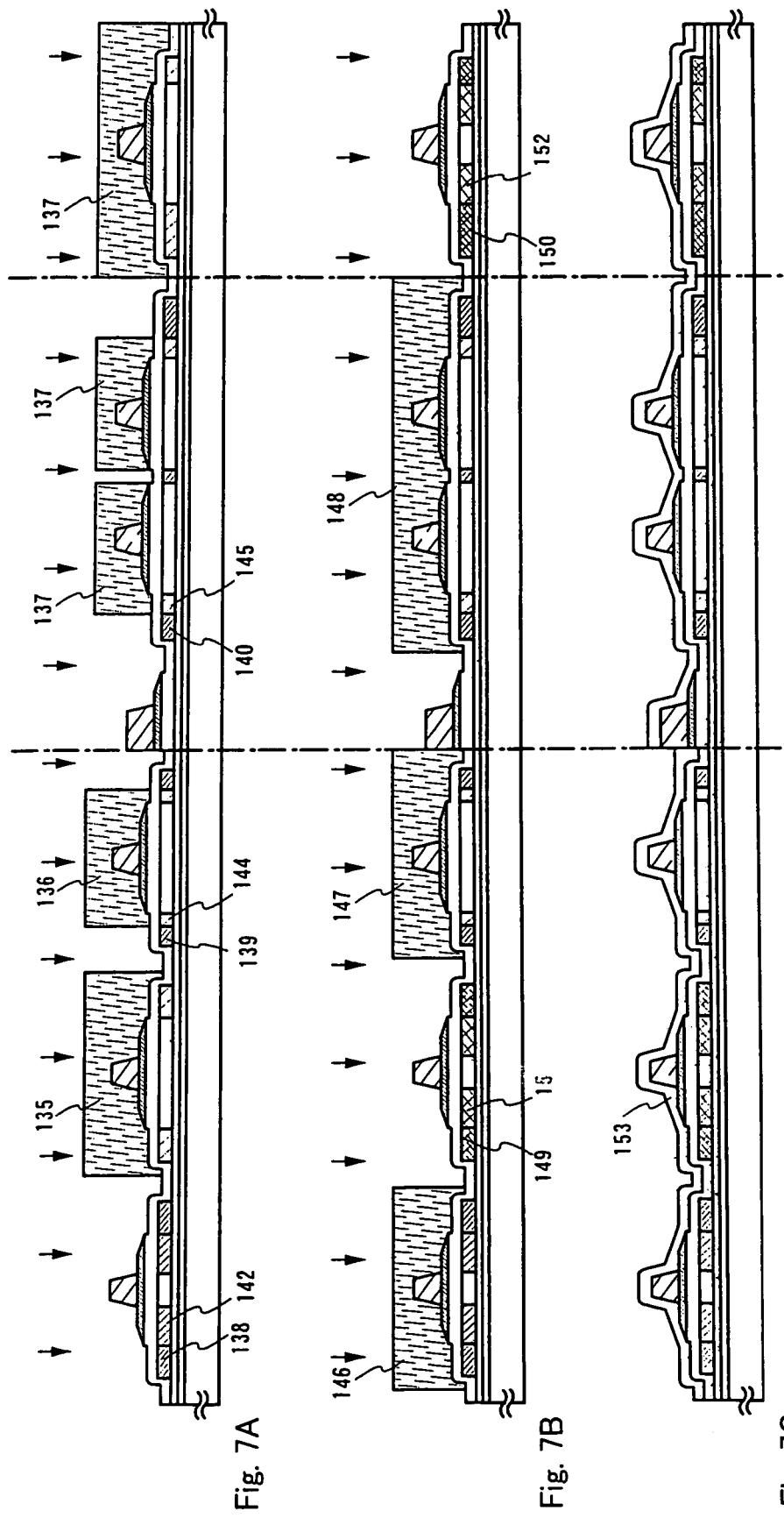
FIGS. 7A to 7C are views illustrating the active matrix substrate.

Subsequently, as shown in FIG. 7A, masks 135 to 137 made of resist are formed, and a second doping process is conducted. The mask 135 is a mask for protecting a channel forming region and a periphery thereof of a semiconductor layer forming a p-channel TFT of a driver circuit, the mask 136 is a mask for protecting a channel forming region and a periphery thereof of a semiconductor layer forming one of n-channel TFTs of the driver circuit, and the mask 137 is a mask for protecting a channel forming region, a periphery thereof, and a storage capacitor of a semiconductor layer forming a TFT of a pixel portion.

With the ion doping conditions in the second doping process: a dosage of $1.5×10^{15}$ atoms/cm$^2$; and an accelerating voltage of 60 to 100 keV, phosphorous (P) is doped. Here, impurity regions are formed in the respective semiconductor layers in a self-aligning manner with the second conductive layers 124b to 126b as masks. Of course, phosphorous is not added to the regions covered by the masks 135 to 137. Thus, second impurity regions 138 to 140 and a third impurity region 142 are formed. The impurity element imparting n-type conductivity is added to the second impurity regions 138 to 140 in a concentration range of $1×10^{20}$ to $1×10^{21}$/cm$^3$. Here, the region having the same concentration range as the second impurity region is also called an n$^+$ region.

Further, the third impurity region is formed at a lower concentration than that in the second impurity region by the first conductive layer, and is added with the impurity element imparting n-type conductivity in a concentration range of $1×10^{18}$ to $1×10^{19}$/cm$^3$. Note that since doping is conducted by passing the portion of the first conductive layer having a tapered shape, the third impurity region has a concentration gradient in which an impurity concentration increases toward the end portion of the tapered portion. Here, the region having the same concentration range as the third impurity region is called an n$^-$ region. Furthermore, the regions covered by the masks 136 and 137 are not added with the impurity element in the second doping process, and become first impurity regions 144 and 145.

Next, after the masks 135 to 137 made of resist are removed, masks 146 to 148 made of resist are newly formed, and a third doping process is conducted as shown in FIG. 7B.

In the driver circuit, by the third doping process as described above, fourth impurity regions 149, 150 and fifth impurity regions 151, 152 are formed in which an impurity element imparting p-type conductivity is added to the semiconductor layer forming the p-channel TFT and to the semiconductor layer forming the storage capacitor.

Further, the impurity element imparting p-type conductivity is added to the fourth impurity regions 149 and 150 in a concentration range of $1×10^{20}$ to $1×10^{21}$/cm$^3$. Note that, in the fourth impurity regions 149, 150, phosphorous (P) has been added in the preceding step (n$^{--}$ region), but the impurity element imparting p-type conductivity is added at a concentration that is 1.5 to 3 times as high as that of phosphorous. Thus, the fourth impurity regions 149, 150 have a p-type conductivity. Here, the region having the same concentration range as the fourth impurity region is also called a p⁺ region.

Further, fifth impurity regions 151 and 152 are formed in regions overlapping the tapered portion of the second conductive layer 125*a*, and are added with the impurity element imparting p-type conductivity in a concentration range of $1\times10^{18}$ to $1\times10^{20}/\text{cm}^3$. Here, the region having the same concentration range as the fifth impurity region is also called a p⁻ region.

Through the above-described steps, the impurity regions having n-type or p-type conductivity are formed in the respective semiconductor layers. The conductive layers 124 to 127 become gate electrodes of a TFT. Further, the conductive layer 128 becomes one of electrodes, which forms the storage capacitor in the pixel portion. Moreover, the conductive layer 129 forms a source wiring in the pixel portion.

If the conductive layers 124 to 127 and the impurity region (the first impurity region to the fifth impurity region) are formed, the above-mentioned step order is not limited. The respective etching step order and the respective doping step order can be properly changed.

Next, an insulating film (not shown) that covers substantially the entire surface is formed. In this example, a 50 nm thick silicon oxide film is formed by plasma CVD. Of course, the insulating film is not limited to a silicon oxide film, and other insulating films containing silicon may be used in a single layer or a lamination structure.

Then, a step of activating the impurity element added to the respective semiconductor layers is conducted. In this activation step, a rapid thermal annealing (RTA) method using a lamp light source, a method of irradiating light emitted from a YAG laser or excimer laser from the back surface, heat treatment using a furnace, or a combination thereof is employed.

Further, although an example in which the insulating film is formed before the activation is shown in this example, a step of forming the insulating film may be conducted after the activation is conducted.

Next, a first interlayer insulating film 153 is formed of a silicon nitride film, and heat treatment (300 to 550° C. for 1 to 12 hours) is performed, thereby conducting a step of hydrogenating the semiconductor layers. (FIG. 7C) This step is a step of terminating dangling bonds of the semiconductor layers by hydrogen contained in the first interlayer insulating film 153. The semiconductor layers can be hydrogenated irrespective of the existence of an insulating film (not shown) formed of a silicon oxide film. Incidentally, in this example, a material containing aluminum as its main constituent is used for the second conductive layer, and thus, it is important to apply the heating process condition that the second conductive layer can withstand in the step of hydrogenation. As another means for hydrogenation, plasma hydrogenation (using hydrogen excited by plasma) may be conducted.

Next, a second interlayer insulating film 154 is formed from an organic insulating material on the first interlayer insulating film 153. In this example, an acrylic resin film with a thickness of 1.6 μm is formed. Then, a contact hole (not shown) that reaches the source wiring 129, contact holes (not shown) that respectively reach the conductive layers 127 and 128, and contact holes (not shown) that reach the respective impurity regions are formed. In this example, a plurality of etching processes is sequentially performed. In this example, the second interlayer insulting film is etched with the first interlayer insulating film as the etching stopper, the first interlayer insulating film is etched with the insulating film (not shown) as the etching stopper, and then, the insulating film (not shown) is etched.

Thereafter, wirings and pixel electrode are formed by using Al, Ti, Mo, W and the like. As the material of the electrodes and pixel electrode, it is desirable to use a material excellent in reflecting property, such as a film containing Al or Ag as its main constituent or a lamination film of the above film. Thus, source electrodes or drain electrodes 155 to 160, a gate wiring 162, a connection wiring 161, and a pixel electrode 163 are formed.

As described above, a driver circuit 206 having an n-channel TFT 201, a p-channel TFT 202, and an n-channel TFT 203 and a pixel portion 207 having a pixel TFT 204 comprised of an n-channel TFT and a storage capacitor 205 can be formed on the same substrate. (FIG. 8) In this specification, the above substrate is called an active matrix substrate for the sake of convenience.

In the pixel portion 207, the pixel TFT 204 (n-channel TFT) has a channel forming region 167, the first impurity region (n⁻⁻ region) 145 formed outside the conductive layer 127 forming the gate electrode, and the second impurity region (n⁺ region) 140 functioning as a source region. Further, in the semiconductor layer functioning as one of the electrodes of the storage capacitor 205, the fourth impurity region 150 and the fifth impurity region 152 are formed. The storage capacitor 205 is constituted of the second electrode 128 and the semiconductor layers 150, 152, and 168 with the insulating film (the same film as the gate insulating film) 116 as dielectric.

Further, in the driver circuit 206, the n-channel TFT 201 (first n-channel TFT) has a channel forming region 164, the third impurity region (n⁻ region) 142 that overlaps a part of the conductive layer 124 forming the gate electrode through the insulating film, and the second impurity region (n⁺ region) 138 functioning as a source region or a drain region.

Further, in the driver circuit 206, the p-channel TFT 202 has a channel forming region 165, the fifth impurity region (p⁻ region) 151 that overlaps a part of the conductive layer 125 forming the gate electrode through the insulating film, and the fourth impurity region (p⁺ region) 149 functioning as a source region or a drain region.

Furthermore, in the driver circuit 206, the n-channel TFT 203 (second n-channel TFT) has a channel forming region 166, the first impurity region (n⁻⁻ region) 144 outside the conductive layer 126 forming the gate electrode, and the second impurity region (n⁺ region) 139 functioning as a source region or a drain region.

The above TFTs 201 to 203 are appropriately combined to form a shift resister circuit, a buffer circuit, a level shifter circuit, a latch circuit and the like, thereby forming the driver circuit 206. For example, in the case where a CMOS circuit is formed, the n-channel TFT 201 and the p-channel TFT 202 may be complementarily connected to each other.

In particular, the structure of the n-channel TFT 203 is appropriate for the buffer circuit having a high driving voltage with the purpose of preventing deterioration due to a hot carrier effect.

Moreover, the structure of the n-channel TFT 201, which is a GOLD structure, is appropriate for the circuit in which the reliability takes top priority.

From the above, the reliability can be improved by improving the flatness of the semiconductor film surface. Thus, in the TFT having the GOLD structure, sufficient reliability can be obtained even if the area of the impurity region that overlaps the gate electrode through the gate insulating film is reduced. Specifically, in the TFT having the GOLD structure, sufficient reliability can be obtained even if the size of the portion that becomes the tapered portion of the gate electrode is reduced.

In the TFT with the GOLD structure, a parasitic capacitance increases when the gate insulating film is thinned. However, the size of the tapered portion of the gate electrode (first conductive layer) is reduced to reduce the parasitic capacitance, whereby the TFT becomes to enable high-speed operation with improved f-characteristics and to have sufficient reliability.

Note that, in the pixel TFT of the pixel portion 207 as well, the second laser light irradiation enables the reduction in off current and the reduction in fluctuation.

Further, an example of manufacturing the active matrix substrate for forming a reflection type display device is shown in this example. However, if the pixel electrode is formed of a transparent conductive film, a transmission type display device can be formed although the number of photomasks is increased by one.

Example 2

This example describes a process of manufacturing an active matrix liquid crystal display device from the active matrix substrate fabricated in Example 1. The description is given with reference to FIG. 9.

Figure 8:
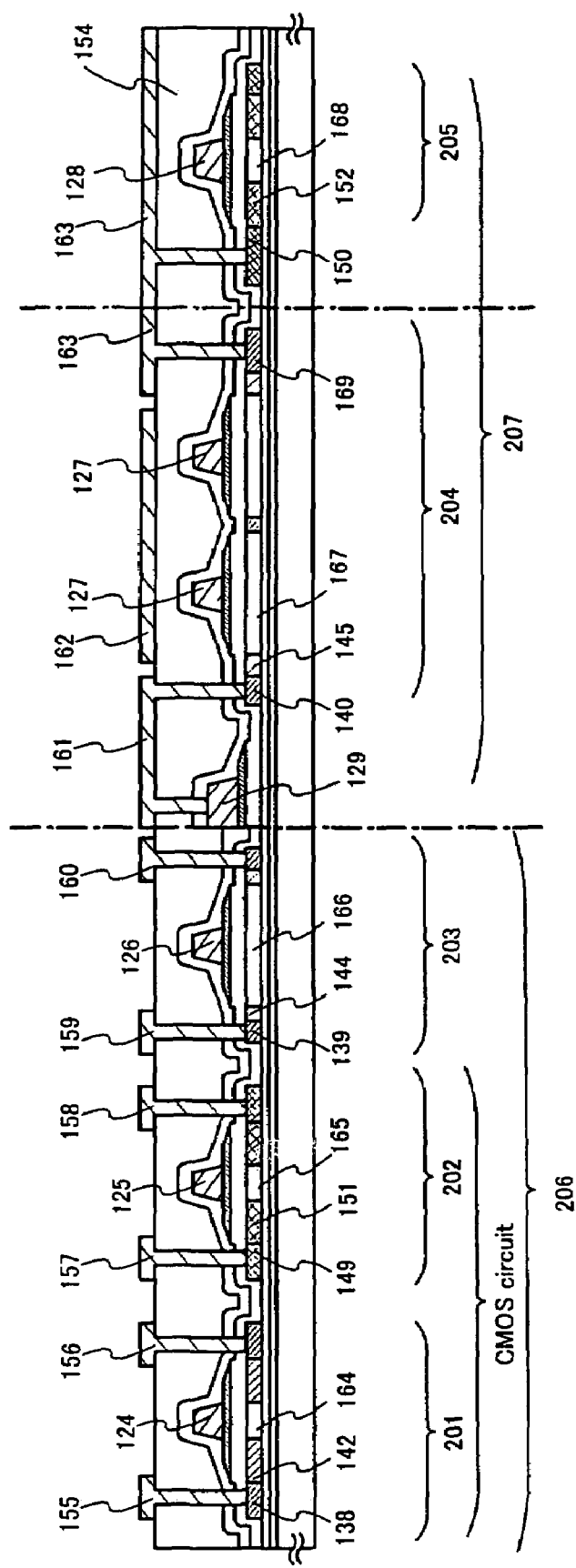
FIG. 8 is a view illustrating the active matrix substrate.

After the active matrix substrate as illustrated in FIG. 8 is obtained in accordance with Example 1, an oriented film is formed on the active matrix substrate of FIG. 8 and subjected to rubbing treatment. In this example, before the oriented film is formed, an organic resin film such as an acrylic resin film is patterned to form columnar spacers in desired positions in order to keep the substrates apart. The columnar spacers may be replaced by spherical spacers sprayed onto the entire surface of the substrate.

An opposite substrate is prepared next. The opposite substrate has a color filter in which colored layers and light-shielding layers are arranged with respect to the pixels. A light-shielding layer is also placed in the driving circuit portion. A planarization film is formed to cover the color filter and the light-shielding layer. On the planarization film, an opposite electrode is formed from a transparent conductive film in the pixel portion. An oriented film is formed over the entire surface of the opposite substrate and is subjected to rubbing treatment.

Then the opposite substrate is bonded to the active matrix substrate on which the pixel portion and the driving circuits are formed, using a sealing member. The sealing member has filler mixed therein and the filler, together with the columnar spacers, keeps the distance between the two substrates while they are bonded. Thereafter a liquid crystal material is injected between the substrates and an encapsulant (not shown) is used to completely seal the substrates. A known liquid crystal material can be used. The active matrix liquid crystal display device is thus completed. If necessary, the active matrix substrate or the opposite substrate is cut into pieces of desired shapes. The display device may be appropriately provided with a polarizing plate using a known technique. Then FPCs are attached to the substrate using a known technique.

Figure 9:
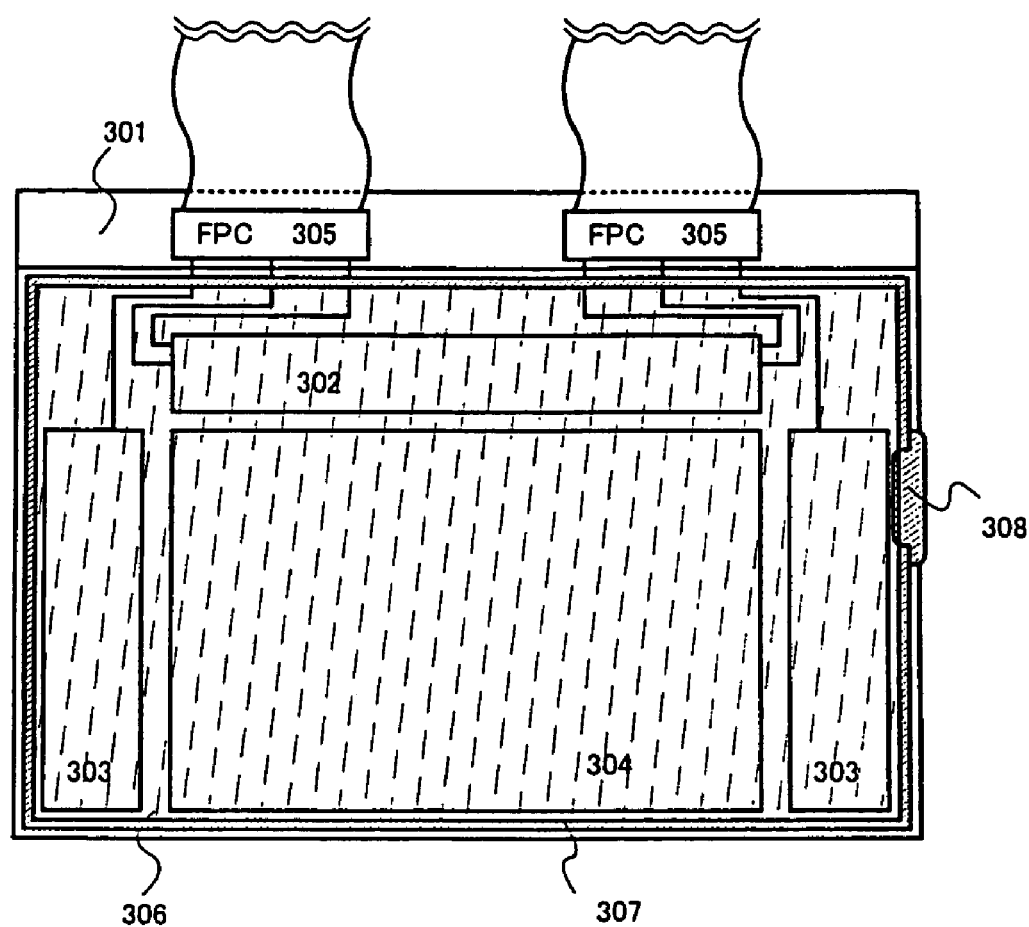
FIG. 9 is a view illustrating the appearance of AM-LCD.

The structure of the thus obtained liquid crystal module is described with reference to the top view in FIG. 9.

A pixel portion 304 is placed in the center of an active matrix substrate 301. A source signal line driving circuit 302 for driving source signal lines is positioned above the pixel portion 304. Gate signal line driving circuits 303 for driving gate signal lines are placed to the left and right of the pixel portion 304. Although the gate signal line driving circuits 303 are symmetrical with respect to the pixel portion in this example, the liquid crystal module may have only one gate signal line driving circuit on one side of the pixel portion. Of the above two options, a designer can choose the arrangement that suits better considering the substrate size or the like of the liquid crystal module. However, the symmetrical arrangement of the gate signal line driving circuits shown in FIG. 9 is preferred in terms of circuit operation reliability, driving efficiency, and the like.

Signals are inputted to the driving circuits from flexible printed circuits (FPC) 305. The FPCs 305 are press-fit through an anisotropic conductive film or the like after opening contact holes in the interlayer insulating film and resin film and forming a connection electrode so as to reach the wiring lines arranged in given places of the substrate 301. The connection electrode is formed from ITO in this example.

A sealing agent 307 is applied to the substrate along its perimeter surrounding the driving circuits and the pixel portion. An opposite substrate 306 is bonded to the substrate 301 by the sealing agent 307 while a spacer formed in advance on the active matrix substrate keeps the distance between the two substrates constant (the distance between the substrate 301 and the opposed substrate 306). A liquid crystal element is injected through an area of the substrate that is not coated with the sealing agent 307. The substrates are then sealed by an encapsulant 308. The liquid crystal module is completed through the above steps.

Although all of the driving circuits are formed on the substrate in the example shown here, several ICs may be used for some of the driving circuits.

Further, this example can be freely combined with any structures in Example 1.

Example 3

Example 1 shows an example of reflective display device in which a pixel electrode is formed from a reflective metal material. Shown in this example is an example of transmissive display device in which a pixel electrode is formed from a light-transmitting conductive film.

The manufacture process up through the step of forming an interlayer insulating film is identical with the process of Example 1, and the description thereof is omitted here. After the interlayer insulating film is formed in accordance with Example 1, a pixel electrode 601 is formed from a light-transmitting conductive film. Examples of the light-transmitting conductive film include an ITO (indium tin oxide alloy) film, an indium oxide-zinc oxide alloy ($In_2O_3$—ZnO) film, a zinc oxide (ZnO) film, and the like.

Thereafter, contact holes are formed in an interlayer insulating film 600. A connection electrode 602 overlapping the pixel electrode is formed next. The connection electrode 602 is connected to a drain region through the contact hole. At the same time the connection electrode is formed, source electrodes or drain electrodes of other TFTs are formed.

Although all of the driving circuits are formed on the substrate in the example shown here, several ICs may be used for some of the driving circuits.

Figure 10:
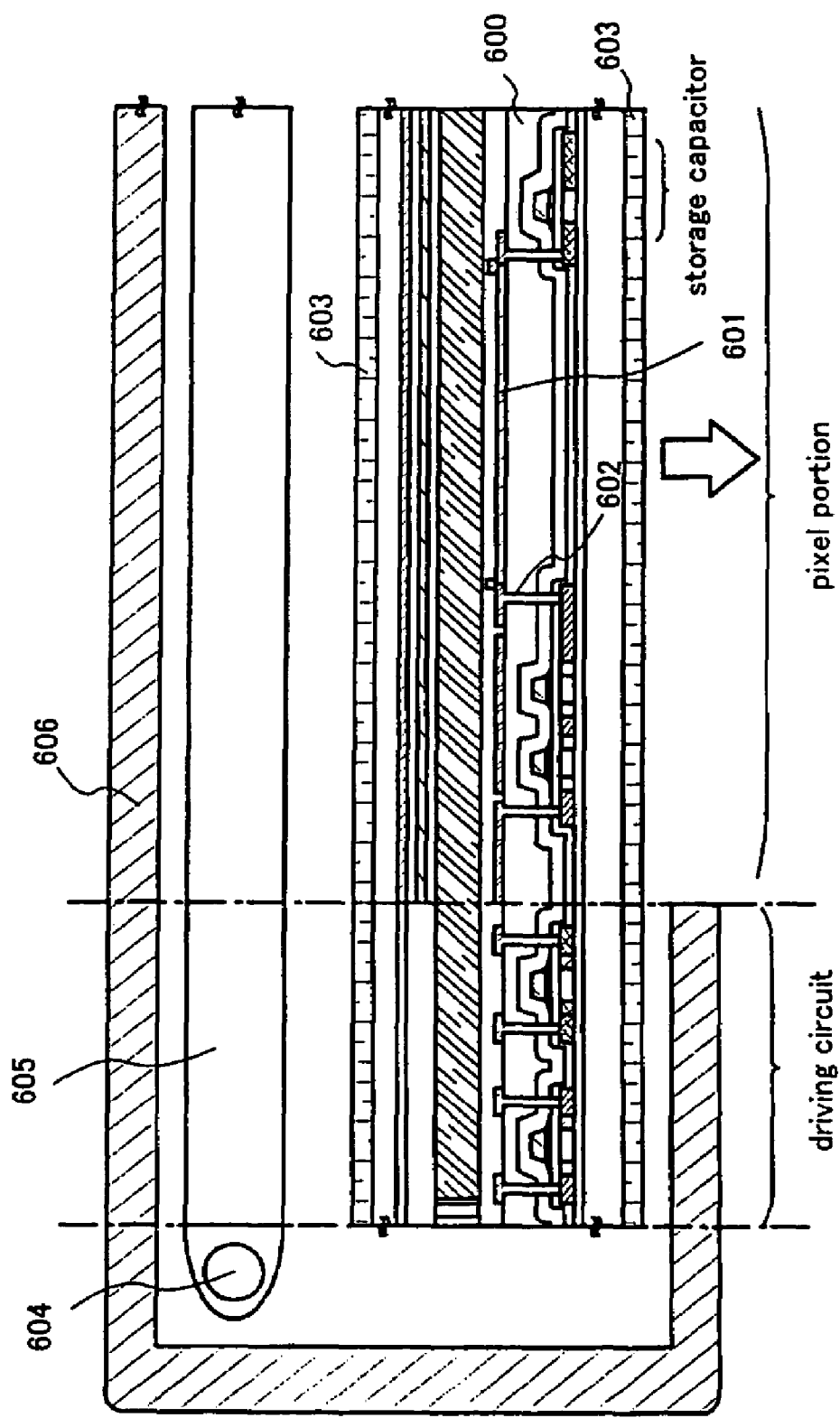
FIG. 10 is a view illustrating a transmission-type liquid crystal display device.

An active matrix substrate is completed as above. A liquid crystal module is manufactured from this active matrix substrate in accordance with Example 2. The liquid crystal module is provided with a backlight 604 and a light guiding plate 605, and is covered with a cover 606 to complete the active matrix liquid crystal display device of which a partial sectional view is shown in FIG. 10. The cover is bonded to the liquid crystal module using an adhesive or an organic resin. When bonding the substrate to the opposite substrate, the substrates may be framed so that the space between the frame and the substrates is filled with an organic resin for bonding. Since the display device is of transmissive type, the active matrix substrate and the opposite substrate each needs a polarizing plate 603 to be bonded.

This example can be freely combined with any structures in Example 1 or 2.

Example 4

Figure 11A:
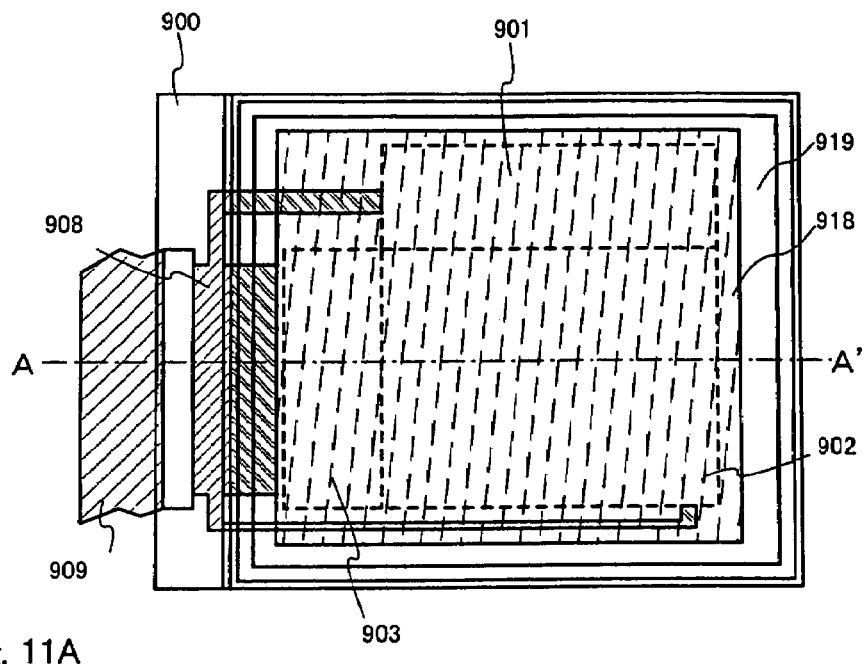
FIG. 11A is a view of an EL module in an upper plan and FIG. 11B is a view of the EL module in a cross section.
Figure 11B:
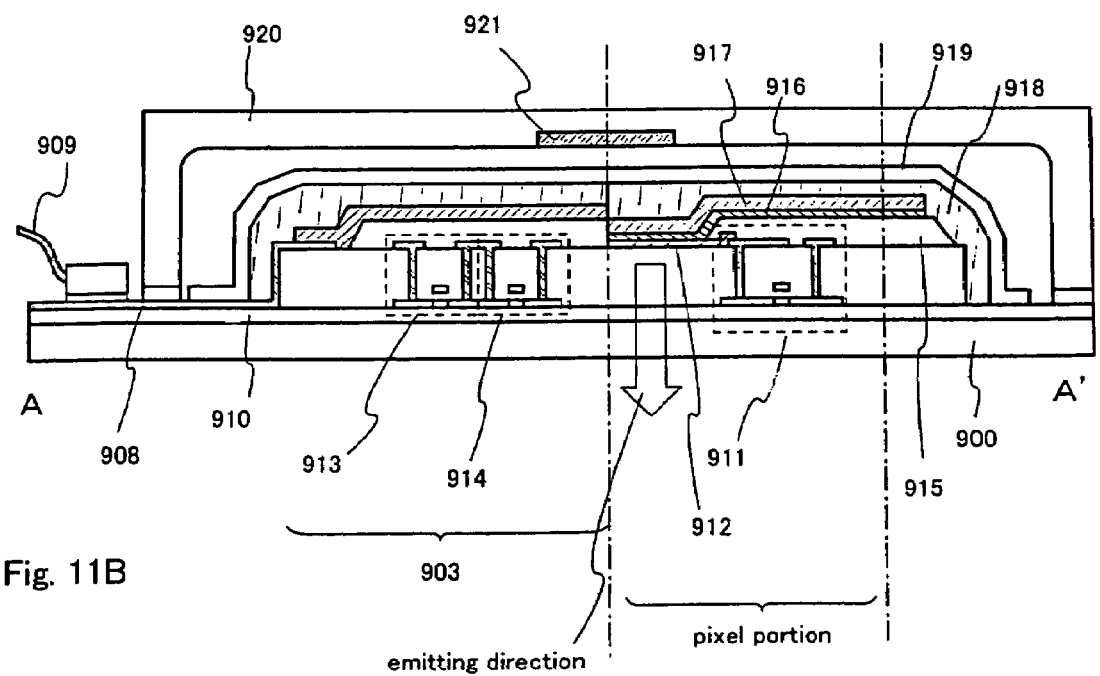

In this example, an example of manufacturing a light emitting display device provided with an EL (electro luminescence) element is shown in FIGS. 11A and 11B.

FIG. 11A is a top view of an EL module, and FIG. 11B is a sectional view taken along a line A-A' of FIG. 11A. On a substrate 900 having an insulating surface (for example, a glass substrate, a crystallized glass substrate, a plastic substrate or the like), a pixel portion 902, a source side driver circuit 901, and a gate side driver circuit 903 are formed. The pixel portion and the driver circuits can be obtained in accordance with the above-described examples.

Further, reference numeral 918 indicates a sealing member, and reference numeral 919 indicates a protective film (DLC film or the like). The pixel portion and the driver circuit portions are covered by the sealing member 918, and the sealing member is covered by a protective film 919. Further, the protective film 919 is sealed by a cover member 920 using an adhesive. It is desirable that the cover member 920 is made of the same material as the substrate 900, for example, is a glass substrate in order to withstand deformation due to heat or external force. The cover member 920 is processed to have the convex shape (with a depth of 3 to 10 µm) shown in FIG. 11B by sandblasting or the like. It is desirable that the cover member 920 is further processed to form a convex portion (with a depth of 50 to 200 µm) into which a drying agent 921 can be arranged. Further, in the case where multiple EL modules are manufactured, after the substrate and the cover member are attached with each other, segmentation may be conducted using a $CO_2$ laser or the like such that end surfaces match with each other.

Note that reference numeral 908 indicates a wiring for transmitting signals input to the source side driver circuit 901 and the gate side driver circuit 903, and receives a video signal and a clock signal from an FPC (flexible printed circuit) 909 that is an external input terminal. Note that although only the FPC is shown in the figure, a printed wiring board (PWB) may be attached to the FPC. The light emitting device in this specification includes not only the main body of the light emitting device but also the light emitting-device attached with the FPC or PWB.

Next, the sectional structure is described with reference to FIG. 11B. An insulating film 910 is provided on the substrate 900, the pixel portion 902 and the gate side driver circuit 903 are formed above the insulating film 910, and the pixel portion 902 is constituted of a plurality of pixels including a current control TFT 911 and a pixel electrode 912 electrically connected to a drain of the current control TFT 911. Further, the gate side driver circuit 903 is formed by using a CMOS circuit in which an n-channel TFT 913 and a p-channel TFT 914 are combined.

The above TFTs (including 911, 913, and 914) may be manufactured in accordance with the n-channel TFT 201 and the p-channel TFT 202 in Example 1.

Note that, as to a material of the insulating film provided between the TFT and the EL element, it is appropriate to use a material that not only blocks diffusion of impurity ions such as alkali metal ions or alkaline-earth metal ions but also positively adsorbs the impurity ions such as alkali metal ions or alkaline-earth metal ions, and further to use a material that can withstand a subsequent process temperature. As the material that satisfies the above conditions, a silicon nitride film containing a large amount of fluorine is given as an example. The concentration of fluorine contained in the silicon nitride film is $1 \times 10^{19}/cm^3$ or more, and preferably, the composition ratio of fluorine in the silicon nitride film is 1 to 5%. Fluorine in the silicon nitride film bonds to alkali metal ions or alkaline-earth metal ions, and is adsorbed into the film. Further, as another example, there is given an organic resin film containing particulates comprised of a stibium (Sb) compound, a stannum (Sn) compound or an indium (In) compound, which adsorbs alkali metal ions, alkaline-earth metal ions or the like, for example, an organic resin film containing particulates of stibium pentoxide ($Sb_2O_5 \cdot nH_2O$). Note that this organic resin film contains particulates with an average particle size of 10 to 20 nm, and has high light transmission properties. The stibium compound typified by the stibium pentoxide particulates is likely to adsorb impurity ions such as alkali metal ions or alkaline-earth metal ions.

The pixel electrode 912 functions as an anode of a light emitting element (EL element). Further, banks 915 are formed at both ends of the pixel electrode 912, and an EL layer 916 and a cathode 917 of the light emitting element are formed on the pixel electrode 912.

As to the EL layer 916, a light emitting layer, a charge transportation layer and a charge injection layer may be freely combined to form an EL layer (layer for light emission and movement of carrier for light emission). For example, a low molecular weight organic EL material or a high molecular weight organic EL material may be used. Further, as the EL layer, a thin film formed from a light emitting material that emits light by singlet excitation (fluorescence) (singlet compound) or a thin film formed from a light emitting material that emits light by triplet excitation (phosphorescence) (triplet compound) can be used. Further, an inorganic material such as silicon carbide can be used for the charge transportation layer or the charge injection layer. Known materials can be used for the organic EL materials or inorganic materials.

A cathode 917 also functions as a wiring common to all the pixels, and is electrically connected to the FPC 909 through the connection wiring 908. Further, all the elements contained in the pixel portion 902 and the gate side driver circuit 903 are covered by the cathode 917, the sealing member 918 and the protective film 919.

Note that a material that is transparent or semitransparent to visible light is preferably used for the sealing member 918. Further, the sealing member 918 is desirably formed from a material that does not permeate moisture or oxygen as much as possible.

Further, after the light emitting element is completely covered by the sealing member 918, it is preferable that the protective film 919 comprised of a DLC film or the like is provided at least on the surface (exposed surface) of the sealing member 918 as shown in FIGS. 11A and 11B. Further, the protective film may be provided on the entire surface including the back surface of the substrate. Here, it is necessary that attention is paid to in order that the protective film is not deposited to the portion where the external input terminal (FPC) is provided. A mask may be used in order not to form the protective film. Alternatively, the external input terminal portion may be covered by a tape, which is used as a masking tape in a CVD apparatus, in order not to form the protective film.

The light emitting element is sealed by the sealing member 918 and the protective film with the above-described structure, whereby the light emitting element can be completely shut from the outside. Thus, it is possible to prevent a substance that promotes deterioration due to oxidization of the EL layer, such as moisture or oxygen from permeating from the outside. Therefore, the light emitting device with high reliability can be obtained.

Figure 12:
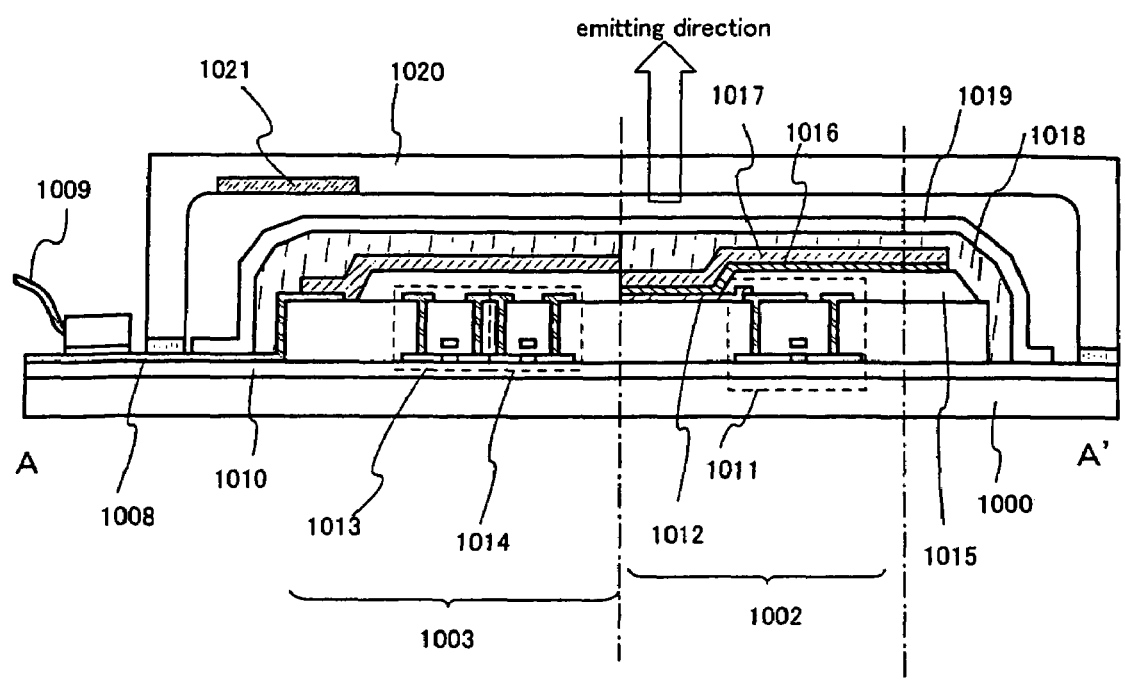
FIG. 12 is a view of the EL module in cross section.

Further, the structure may be adopted in which a pixel electrode is a cathode, and an EL layer and an anode are laminated to thereby provide light emission in an opposite direction to that in FIGS. 11A and 11B. FIG. 12 shows an example thereof. Note that a top view of the example is the same as that of FIG. 11A, and thus is omitted.

A sectional structure shown in FIG. 12 is described below. As a substrate 1000, a semiconductor substrate or a metal substrate can be used besides a glass substrate and a quartz substrate. An insulating film 1010 is provided on the substrate 1000, a pixel portion 1002 and a gate side driver circuit 1003 are formed above the insulating film 1010, the pixel portion 1002 is constituted of a plurality of pixels including a current control TFT 1011 and a pixel electrode 1012 electrically connected to a drain of the current control TFT 1011. Further, the gate side driver circuit 1003 is formed by using a CMOS circuit in which an n-channel TFT 1013 and a p-channel TFT 1014 are combined.

The pixel electrode 1012 functions as a cathode of a light emitting element. Further, banks 1015 are formed at both ends of the pixel electrode 1012, and an EL layer 1016 and an anode 1017 of the light emitting element are formed on the pixel electrode 1012.

The anode 1017 also functions as a wiring common to all the pixels, and is electrically connected to an FPC 1009 via a connection wiring 1008. Further, all the elements contained in the pixel portion 1002 and the gate side driver circuit 1003 are covered by the anode 1017, a sealing member 1018 and a protective film 1019 comprised of a DLC film or the like. Further, a cover member 1020 and the substrate 1000 are bonded by an adhesive. In addition, a concave portion is provided in the cover member, and a drying agent 1021 is arranged therein.

Note that a material that is transparent or semitransparent to visible light is preferably used for the sealing member 1018. Further, the sealing member 1018 is desirably formed from a material that does not permeate moisture and oxygen as much as possible.

Further, in FIG. 12, the pixel electrode is the cathode, and the EL layer and the anode are laminated. Thus, the light emission direction is indicated by an arrow in FIG. 12.

In this example, the TFT with high electrical characteristics and high reliability which is obtained in Example 1 is used, and therefore, there can be formed a light emitting element with higher reliability compared with a conventional element. Further, a light emitting device having such a light emitting element is used as a display portion. Thus, electric equipment with high performance can be obtained.

Note that this example can be freely combined with any of Example 1.

Example 5

The driver circuit and the pixel portion formed by implementing the present invention can be used in various modules (active matrix type liquid crystal module, active matrix type EL module and active matrix type EC module). That is, the present invention can be implemented in all of electronic equipments integrated with the modules at display portions thereof.

As such electronic equipment, there are pointed out a video camera, a digital camera, a head mount display (goggle type display), a car navigation system, a projector, a car stereo, a personal computer, a portable information terminal (mobile computer, cellular phone or electronic book) and the like. Examples of these are shown in FIGS. 13A to 13F, 14A to 14D and 15A to 15C.

Figure 13A:
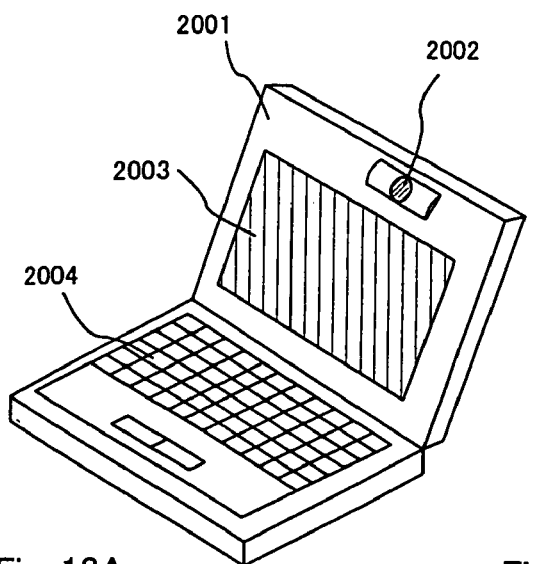
FIGS. 13A to 13F are views illustrating electronic devices.

FIG. 13A shows a personal computer including a main body 2001, an image input portion 2002, a display portion 2003 and a keyboard 2004.

Figure 13B:
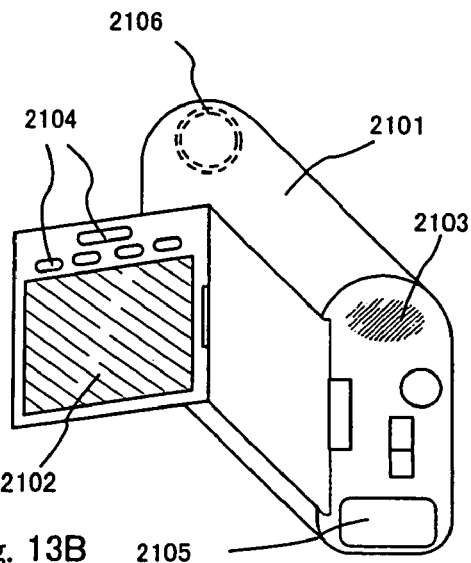

FIG. 13B shows a video camera including a main body 2101, a display portion 2102, a voice input portion 2103, operation switches 2104, a battery 2105 and an image receiving portion 2106.

Figure 13C:
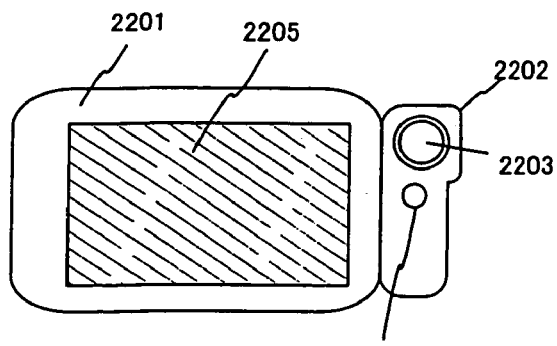

FIG. 13C shows a mobile computer including a main body 2201, a camera portion 2202, an image receiving portion 2203, an operation switch 2204 and a display portion 2205.

Figure 13D:
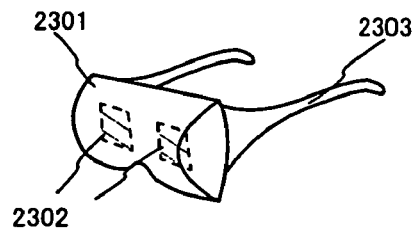

FIG. 13D shows a goggle type display including a main body 2301, a display portion 2302 and an arm portion 2303.

Figure 13E:
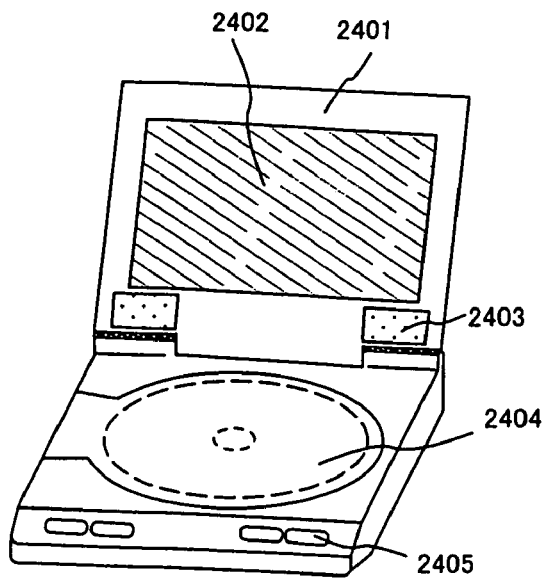

FIG. 13E shows a player using a record medium recorded with programs (hereinafter, referred to as record medium) including a main body 2401, a display portion 2402, a speaker portion 2403, a record medium 2404 and an operation switch 2405. The player uses DVD (digital Versatile Disc) or CD as the record medium and can enjoy music, enjoy movie and carry out game or Internet.

Figure 13F:
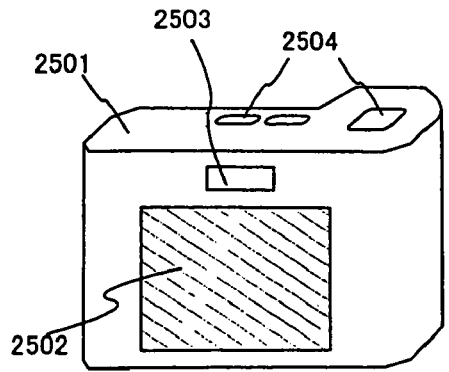

FIG. 13F shows a digital camera including a main body 2501, a display portion 2502, an eye contact portion 2503, operation switches 2504 and an image receiving portion (not illustrated).

Figure 14A:
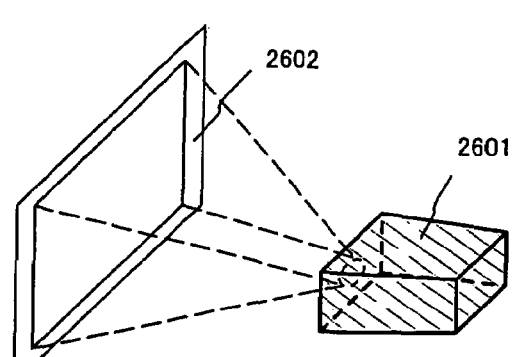
FIGS. 14A to 14D are views illustrating electronic devices.

FIG. 14A shows a front type projector including a projection equipment 2601 and a screen 2602. Example 3 can be applied to the liquid crystal module 2808 forming a part of the projection equipment 2601 to complete the equipment entirely.

Figure 14B:
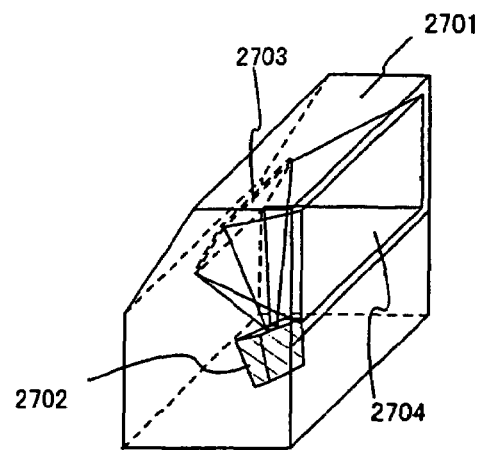

FIG. 14B shows a rear type projector including a main body 2701, a projection equipment 2702, a mirror 2703 and a screen 2704. Example 3 can be applied to the liquid crystal module 2808 forming a part of the projection equipment 2702 to complete the equipment entirely.

Figure 14C:
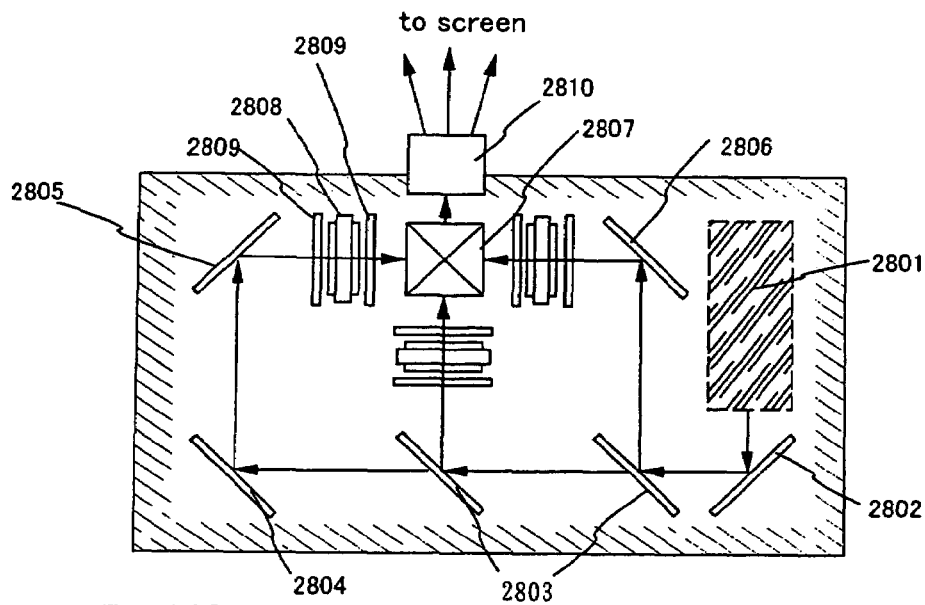

Further, FIG. 14C is a view showing an example of a structure of the projection equipment 2601 and 2702 in FIG. 14A and FIG. 14B. The projection equipment 2601 or 2702 is constituted by a light source optical system 2801, mirrors 2802, and 2804 through 2806, a dichroic mirror 2803, a prism 2807, a liquid crystal display equipment 2808, a phase difference plate 2809 and a projection optical system 2810. The projection optical system 2810 is constituted by an optical system including a projection lens. Although this example shows an example of three plates type, this example is not particularly limited thereto but may be of, for example, a single plate type. Further, person of executing this example may pertinently provide an optical system such as an optical lens, a film having a polarization function, a film for adjusting a phase difference or an IR film in an optical path shown by arrow marks in FIG. 14C.

Figure 14D:
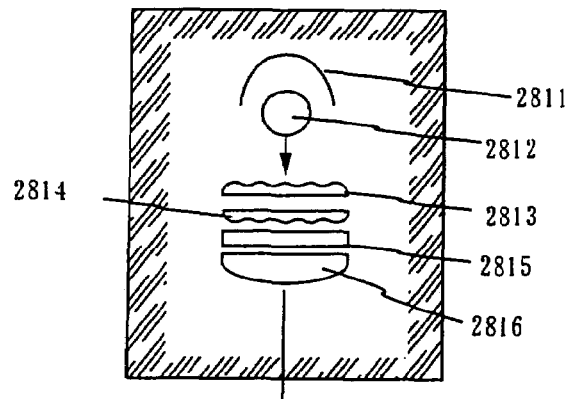

Further, FIG. 14D is a view showing an example of a structure of the light source optical system 2801 in FIG. 14C. According to this example, the light source optical system 2801 is constituted by a reflector 2811, a light source 2812, lens arrays 2813 and 2814, a polarization conversion element 2815 and a focusing lens 2816. Further, the light source optical system shown in FIG. 14D is only an example and this example is not particularly limited thereto. For example, a person of executing this example may pertinently provide an optical system such as an optical lens, a film having a polarization function, a film for adjusting a phase difference or an IR film in the light source optical system.

However, according to the projectors shown in FIGS. 14A and 14B, there is shown a case of using a transmission type electro-optical device and an example of applying a reflection type electro-optical device and EL module are not illustrated.

Figure 15A:
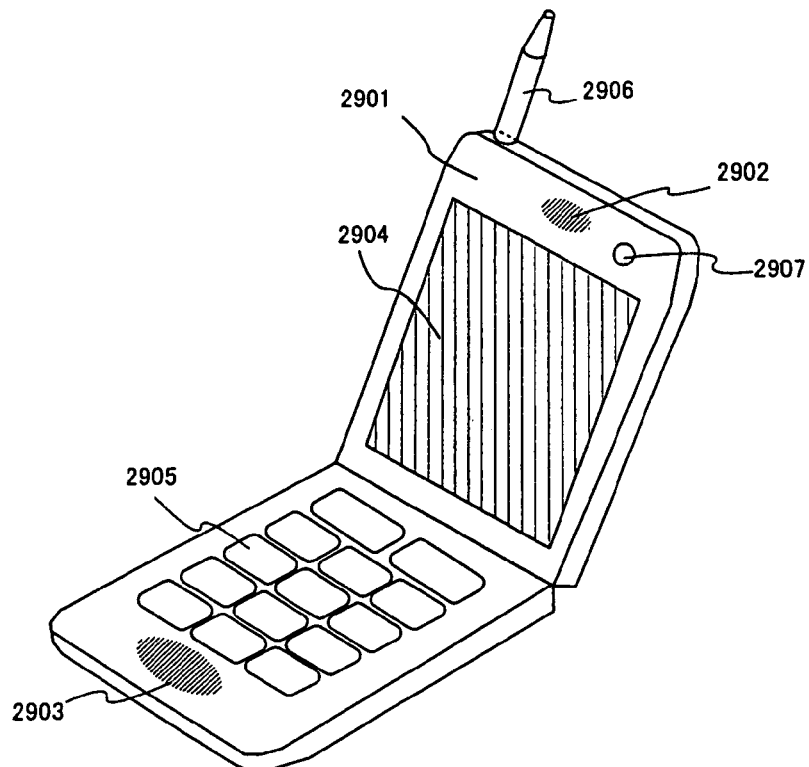
FIGS. 15A to 15C are views illustrating electronic devices.

FIG. 15A shows a cellular phone including a main body 2901, a sound output portion 2902, a sound input portion 2903, a display portion 2904, an operation switch 2905, an antenna 2906 and an image input portion (CCD, image sensor or the like) 2907.

Figure 15B:
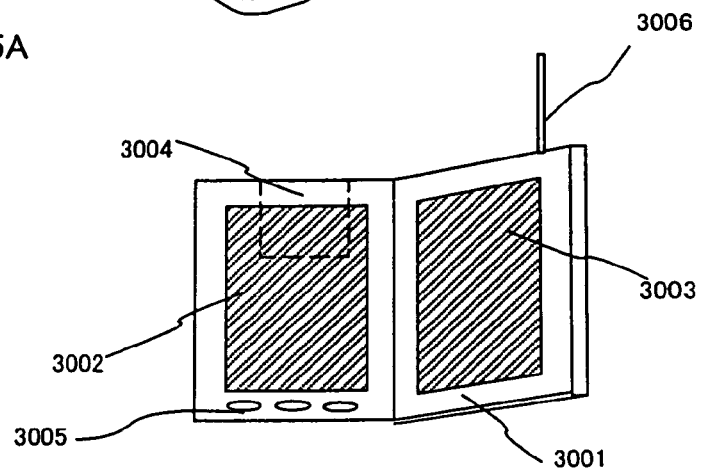

FIG. 15B shows a portable book (electronic book) including a main body 3001, display portions 3002 and 3003, a record medium 3004, an operation switch 3005 and an antenna 3006.

Figure 15C:
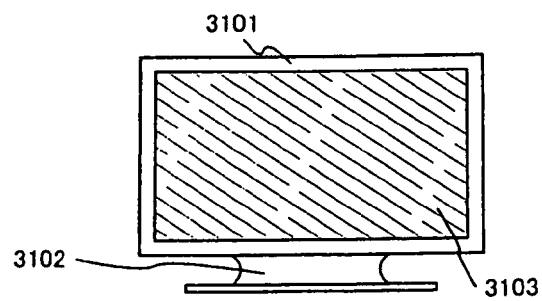

FIG. 15C shows a display including a main body 3101, a support base 3102 and a display portion 3103.

In addition, the display shown in FIG. 15C is small and medium type or large type, for example, screen of the display sized 5 to 20 inches. Moreover, it is preferable to mass-produce by executing a multiple pattern using a substrate sized 1×1 m to form such sized display section.

As has been described, the range of applying the present invention is extremely wide and is applicable to electronic equipment of all the fields. The electronic equipment of the present invention can be implemented by freely combined with the structures in Examples 1 to 4.

This invention makes it possible to form, relying upon the plasma CVD method, an amorphous silicon film containing argon at a high concentration and, concretely speaking, at a concentration of from $1\times10^{20}/cm^3$ to $1\times10^{21}/cm^3$ and containing fluorine at a concentration of lower than $1\times10^{17}/cm^3$.

The invention further makes it possible to obtain a semiconductor film having a crystalline structure containing a very decreased amount of, or without containing, a metal element that assists the crystallization, contributing to improving electric characteristics of the TFT which uses the semiconductor film as an active layer and to decreasing dispersion among the elements. This, in particular in liquid crystal display device, makes it possible to decrease a shade in the display caused by dispersion in the TFT characteristics.

Besides, in a semiconductor device having OLEDs, the invention decreases a dispersion in the on-current ($I_{on}$) of the TFTs (TFTs that feed a current to the OLEDs arranged in the drive circuit or in the pixels) which are so arranged as to feed a constant current to the pixel electrodes, and a dispersion in the brightness is suppressed.

The invention further removes or decreases the amount of not only the metal element that assists the crystallization but also of other metal elements (Fe, Cu, etc.) that are impurities.

What is claimed is:

1. A method of manufacturing an amorphous semiconductor film, comprising:
   introducing a starting gas including silane, a rare gas and hydrogen into a film-forming chamber;
   generating a plasma of said starting gas; and
   forming an amorphous semiconductor film comprising a rare gas element at a concentration of $1\times10^{18}/cm^3$ to $1\times10^{22}/cm^3$ using said plasma,
   wherein said amorphous semiconductor film contains fluorine at a concentration of from $1\times10^{15}/cm^3$ to $1\times10^{17}/cm^3$.

2. A method of manufacturing an amorphous semiconductor film according to claim 1, wherein in generating the plasma, the pressure in the film-forming chamber is from 2.666 Pa to 133.3 Pa.

3. A method of manufacturing an amorphous semiconductor film according to claim 1, wherein the flow rate of hydrogen to the rare gas is controlled to be from 0.2 to 5.

4. A method of manufacturing an amorphous semiconductor film according to claim 1, wherein the RF power density for generating the plasma is from 0.0017 W/cm² to 1 W/cm².

5. A method of manufacturing an amorphous semiconductor film according to claim 1, wherein the rare gas element is on or more kinds selected from He, Ne, Ar, Kr and Xe.

6. A method of manufacturing an amorphous semiconductor film according to claim 1, wherein the silane is monosilane.

7. A method of manufacturing an amorphous semiconductor film according to claim 1, wherein the silane is monosilane and the flow rate of the monosilane to the rare gas introduced into the film-forming chamber is controlled to be from 0.1:99.9 to 1:9.

8. A method of manufacturing an amorphous semiconductor film according to claim 1, wherein the silane is monosilane and the flow rate of the monosilane to the rare gas introduced into the film-forming chamber is controlled to be from 1:99 to 5:95.

9. A method of manufacturing a semiconductor device, comprising:
   forming a gate electrode over a substrate;
   forming a gate insulating film on the gate electrode;
   introducing a starting gas including silane, a rare gas and hydrogen;
   generating a plasma of the starting gas;
   forming an amorphous semiconductor film comprising a rare gas element at a concentration of $1\times10^{18}/cm^3$ to $1\times10^{22}/cm^3$; and
   patterning the amorphous semiconductor film,
   wherein the patterned amorphous semiconductor film contains fluorine at a concentration of from $1\times10^{15}/cm^3$ to $1\times10^{17}/cm^3$.

10. A method of manufacturing a semiconductor device according to claim 9, wherein in generating the plasma, the pressure in the film-forming chamber is from 2.666 Pa to 133.3 Pa.

11. A method of manufacturing a semiconductor device according to claim 9, wherein the flow rate of hydrogen to the rare gas is controlled to be from 0.2 to 5.

12. A method of manufacturing a semiconductor device according to claim 9, wherein the RF power density for generating the plasma is from 0.0017 W/cm² to 1 W/cm².

13. A method of manufacturing a semiconductor device according to claim 9, wherein the rare gas element is one or more kinds selected from He, Ne, Ar, Kr and Xe.

14. A method of manufacturing a semiconductor device according to claim 9, wherein the silane is monosilane.

15. A method of manufacturing a semiconductor device according to claim 9, wherein the silane is monosilane and the flow rate of the monosilane to the rare gas introduced into the film-forming chamber is controlled to be from 0.1:99.9 to 1:9.

16. A method of manufacturing a semiconductor device according to claim 9, wherein the silane is monosilane and the flow rate of the monosilane to the rare gas introduced into the film-forming chamber is controlled to be from 1:99 to 5:95.

* * * * *